(12) United States Patent
Tsumura et al.

(10) Patent No.: US 8,963,319 B2
(45) Date of Patent: Feb. 24, 2015

(54) SEMICONDUCTOR CHIP WITH THROUGH HOLE VIAS

(75) Inventors: Kazumichi Tsumura, Kanagawa-ken (JP); Kazuyuki Higashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 402 days.

(21) Appl. No.: 13/419,751

(22) Filed: Mar. 14, 2012

(65) Prior Publication Data

US 2012/0319296 A1 Dec. 20, 2012

(30) Foreign Application Priority Data

Jun. 20, 2011 (JP) ................................. 2011-136449

(51) Int. Cl.
*H01L 23/12* (2006.01)
*H01L 21/4763* (2006.01)
(Continued)

(52) U.S. Cl.
CPC ............ *H01L 23/562* (2013.01); *H01L 23/481* (2013.01); *H01L 21/76802* (2013.01); *H01L 21/76898* (2013.01); *H01L 23/585* (2013.01); *H01L 25/0657* (2013.01); *H01L 24/16* (2013.01); *H01L 2224/16146* (2013.01); *H01L 2224/16227* (2013.01); *H01L 2225/06513* (2013.01); *H01L 2225/06541* (2013.01); *H01L 2224/16225* (2013.01)
USPC ........... 257/700; 257/758; 257/774; 438/638; 438/639

(58) Field of Classification Search
CPC .................. H01L 21/76877; H01L 21/76843; H01L 23/5226; H01L 23/5384; H01L 23/5385; H01L 23/562; H01L 23/481; H01L 21/76898; H01L 23/585; H01L 25/0657; H01L 24/16; H01L 21/76802
See application file for complete search history.

(56) References Cited

U.S. PATENT DOCUMENTS 7,525,186 B2 * 4/2009 Kim et al. ..................... 257/686
8,232,648 B2 * 7/2012 McGahay et al. ............ 257/758
(Continued)

FOREIGN PATENT DOCUMENTS

CN          1684255 A    10/2005
CN        101154652 A     4/2008
(Continued)

OTHER PUBLICATIONS

Japanese Office Action issued Apr. 2, 2014, in Japan Patent Application No. 2011-136449 (with English translation).
(Continued)

*Primary Examiner* — Alonzo Chambliss
(74) *Attorney, Agent, or Firm* — Oblon, Spivak, McClelland, Maier & Neustadt, L.L.P.

(57) ABSTRACT

According to one embodiment, a semiconductor chip includes a semiconductor substrate, a via and an insulating layer. The semiconductor substrate has a first major surface and a second major surface on opposite side from the first major surface. The semiconductor substrate is provided with a circuit section including an element and a wiring and a guard ring structure section surrounding the circuit section on the first major surface side. The via is provided in a via hole extending from the first major surface side to the second major surface side of the semiconductor substrate. The insulating layer is provided in a first trench extending from the first major surface side to the second major surface side of the semiconductor substrate.

22 Claims, 16 Drawing Sheets

(51) Int. Cl.
*H01L 23/00* (2006.01)
*H01L 23/48* (2006.01)
*H01L 21/768* (2006.01)
*H01L 23/58* (2006.01)
*H01L 25/065* (2006.01)

(56) References Cited

U.S. PATENT DOCUMENTS

2010/0237452 A1 9/2010 Hagiwara et al.
2011/0291279 A1* 12/2011 McGahay et al. ............ 257/758
2013/0130472 A1* 5/2013 Lee et al. ..................... 438/454

FOREIGN PATENT DOCUMENTS

| CN | 101771019 A | 7/2010 |
| JP | 2002-289623 | 10/2002 |
| JP | 2005-286264 | 10/2005 |
| JP | 2009-272490 | 11/2009 |
| JP | 2010-161367 | 7/2010 |
| JP | 2011-54637 | 3/2011 |

OTHER PUBLICATIONS

Combined Chinese Office Action and Search Report issued Jul. 3, 2014 in Patent Application No. 201210071075.X with English Translation.

* cited by examiner

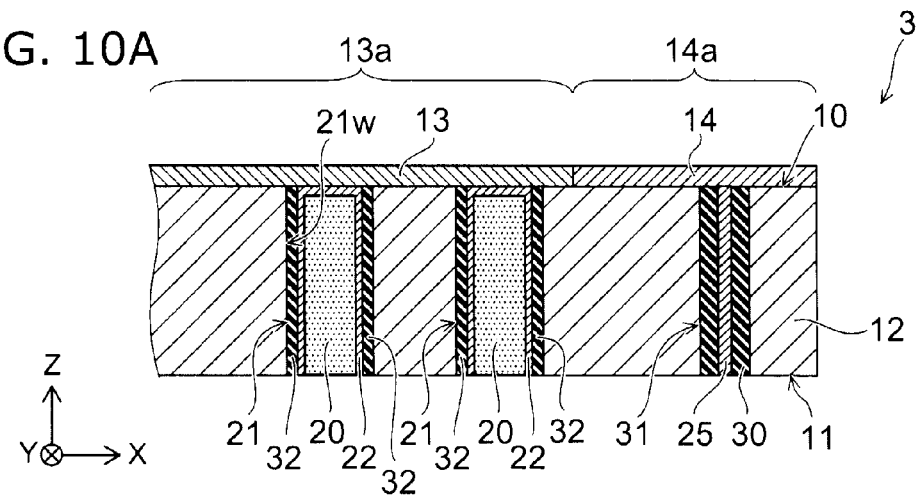
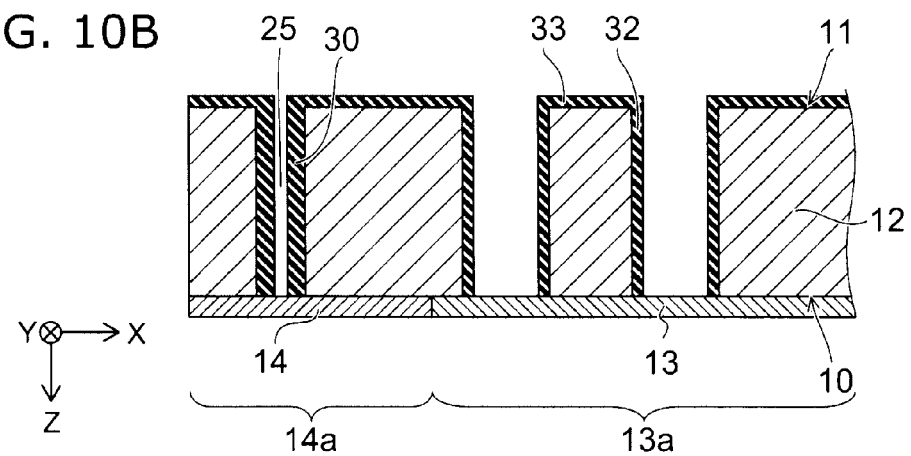
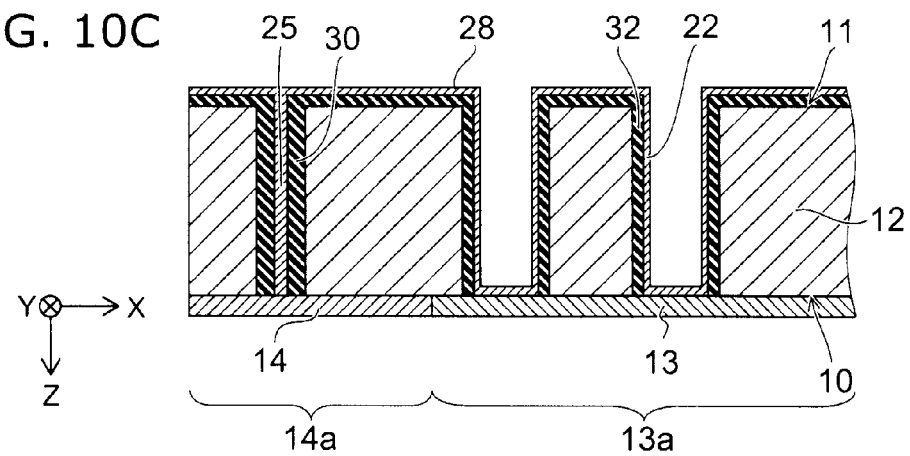

SEMICONDUCTOR CHIP WITH THROUGH HOLE VIAS

CROSS-REFERENCE TO RELATED APPLICATIONS

This application is based upon and claims the benefit of priority from the prior Japanese Patent Application No. 2011-136449, filed on Jun. 20, 2011; the entire contents of which are incorporated herein by reference.

FIELD

Embodiments described herein relate generally to a semiconductor chip and a semiconductor device.

BACKGROUND

In recent semiconductor devices such as multi-chip packages (MCP), stacking of a plurality of semiconductor chips is effectively used to achieve higher density, smaller size, or lower profile.

In this type of semiconductor device, a through silicon via (TSV) has been drawing attention as a technique used in stacking semiconductor chips. In the case where the semiconductor is silicon (Si), for instance, the through silicon via is an electrode penetrating between the major surfaces of a semiconductor substrate, which is the base member of the semiconductor chip. In the process for manufacturing this type of semiconductor device, thinning of the semiconductor chip is required for the purpose of improving the throughput and increasing the integration density in the thickness direction. To reduce the profile of the semiconductor chip, for instance, a technique for grinding the back surface side of the semiconductor substrate is used. In dicing the thinned semiconductor substrate, to suppress chipping and cracking, techniques such as laser dicing or plasma etching are used.

However, this type of dicing is not the mechanical processing using a dicing blade. Hence, a relatively smooth cut surface is formed. This lowers the metal gettering effect of the cut surface, and the metal attached to the cut surface may diffuse into the semiconductor chip. Thus, the characteristics and reliability of the semiconductor device may be degraded.

BRIEF DESCRIPTION OF THE DRAWINGS

FIG. 1A is a schematic sectional view of the semiconductor chip and FIG. 1B is a schematic plan view of the back surface side of the semiconductor chip;

FIG. 4A is a schematic sectional view for describing a manufacturing process for forming a circuit section and a guard ring structure section on the front surface side of the semiconductor chip, FIG. 4B is a schematic sectional view for describing a manufacturing process for forming a via hole and a first trench of the semiconductor chip and FIG. 4C is a schematic plan view on the back surface side;

FIG. 5A shows a manufacturing process for forming an insulating layer in the via hole and in the first trench and FIG. 5B shows a manufacturing process for etching the insulating layer in the via hole;

FIG. 6A shows a manufacturing process for forming a conductive layer on the back surface and in the via hole of the semiconductor substrate and FIG. 6B shows a manufacturing process for forming a via in the via hole;

FIG. 7A shows a manufacturing process for performing dicing processing on the semiconductor substrate and FIG. 7B shows a singulated semiconductor chip;

FIG. 9A is an entire view of the back surface side of the semiconductor chip and FIG. 9B is an enlarged view of portion A of FIG. 9A;

FIGS. 10A to 10C are schematic sectional views of the chip edge region of a semiconductor chip according to a third embodiment, FIG. 10A is a schematic sectional view of the state after the semiconductor chip is formed, FIG. 10B shows a manufacturing process for forming an insulating layer in the via hole and in the first trench and FIG. 10C shows a manufacturing process for forming a barrier metal layer in the via hole and in the first trench;

FIG. 11A shows a manufacturing process for preparing a semiconductor substrate and FIG. 11B shows a manufacturing process for forming a via hole and a first trench in the semiconductor substrate;

FIG. 12A shows a manufacturing process for forming an insulating layer in the via hole and in the first trench and FIG. 12B shows a manufacturing process for forming a barrier metal layer in the via hole;

FIG. 13A shows a manufacturing process for forming a conductive layer in the via hole and on the front surface side of the semiconductor substrate and FIG. 13B shows a manufacturing process for forming a via in the via hole;

FIG. 14A shows a manufacturing process for forming an element section and a guard ring structure section on the front surface side of the semiconductor substrate and FIG. 14B shows a manufacturing process for grinding the back surface side of the semiconductor substrate;

FIG. 15A shows a manufacturing process for forming a via hole and a first trench in the semiconductor substrate and FIG. 15B shows a manufacturing process for forming an insulating layer in the via hole and in the first trench;

FIG. 16A shows a manufacturing process for forming a conductive layer in the via hole and on the front surface side of the semiconductor substrate and FIG. 16B shows a manufacturing process for forming a via in the via hole;

DETAILED DESCRIPTION

Figure 1A:
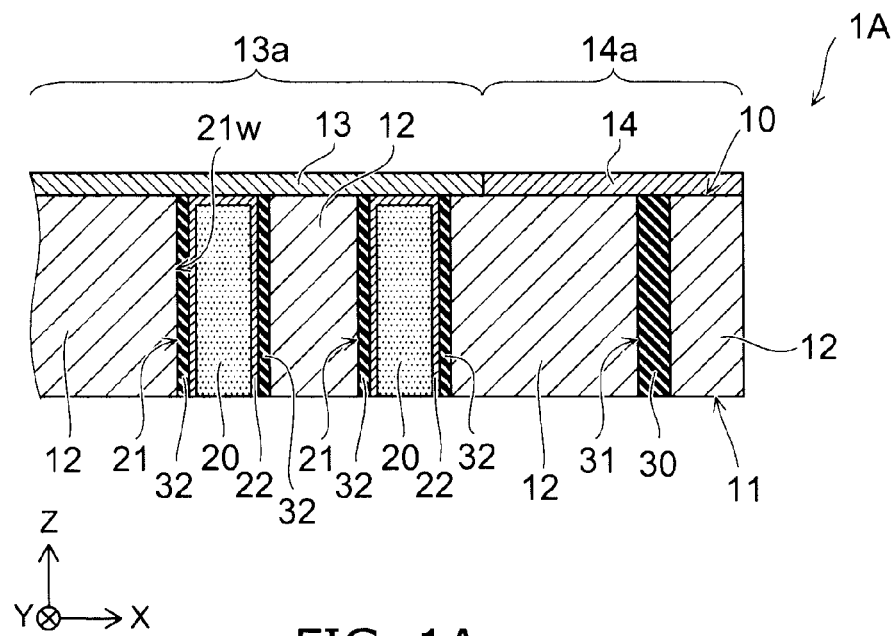
FIGS. 1A and 1B are schematic views of the chip edge region of a semiconductor chip according to a first embodiment.

In general, according to one embodiment, a semiconductor chip includes a semiconductor substrate, a via and an insulating layer. The semiconductor substrate has a first major surface and a second major surface on opposite side from the first major surface. The semiconductor substrate is provided with a circuit section including an element and a wiring and a guard ring structure section surrounding the circuit section on the first major surface side. The via is provided in a via hole extending from the first major surface side to the second major surface side of the semiconductor substrate. The insulating layer is provided in a first trench extending from the first major surface side to the second major surface side of the semiconductor substrate. As viewed in a direction perpendicular to the first major surface of the semiconductor substrate, the via hole is located in a circuit region including the circuit section, the first trench is located in an outer peripheral region surrounding the circuit section and including the guard ring structure section, and width of the first trench in a direction parallel to the first major surface is narrower than width of the via hole in the parallel direction.

According to another embodiment, a semiconductor device includes semiconductor chips. The semiconductor chip includes the semiconductor substrate, a via and an insulating layer. The semiconductor substrate has a first major surface and a second major surface on opposite side from the first major surface. The semiconductor substrate is provided with a circuit section including an element and a wiring and a guard ring structure section surrounding the circuit section on the first major surface side. The via is provided in a via hole extending from the first major surface side to the second major surface side of the semiconductor substrate. The insulating layer is provided in a first trench extending from the first major surface side to the second major surface side of the semiconductor substrate. As viewed in a direction perpendicular to the first major surface of the semiconductor substrate, the via hole is located in a circuit region including the circuit section, the first trench is located in an outer peripheral region surrounding the circuit section and including the guard ring structure section, and width of the first trench in a direction parallel to the first major surface is narrower than width of the via hole in the parallel direction. Two or more of the semiconductor chips are stacked. The two or more semiconductor chips are sealed with a sealing resin.

Various embodiments will be described hereinafter with reference to the accompanying drawings.

Embodiments will now be described with reference to the drawings. In the following description, like members are labeled with like reference numerals, and the description of the members once described is omitted appropriately.

First Embodiment

Figure 1B:
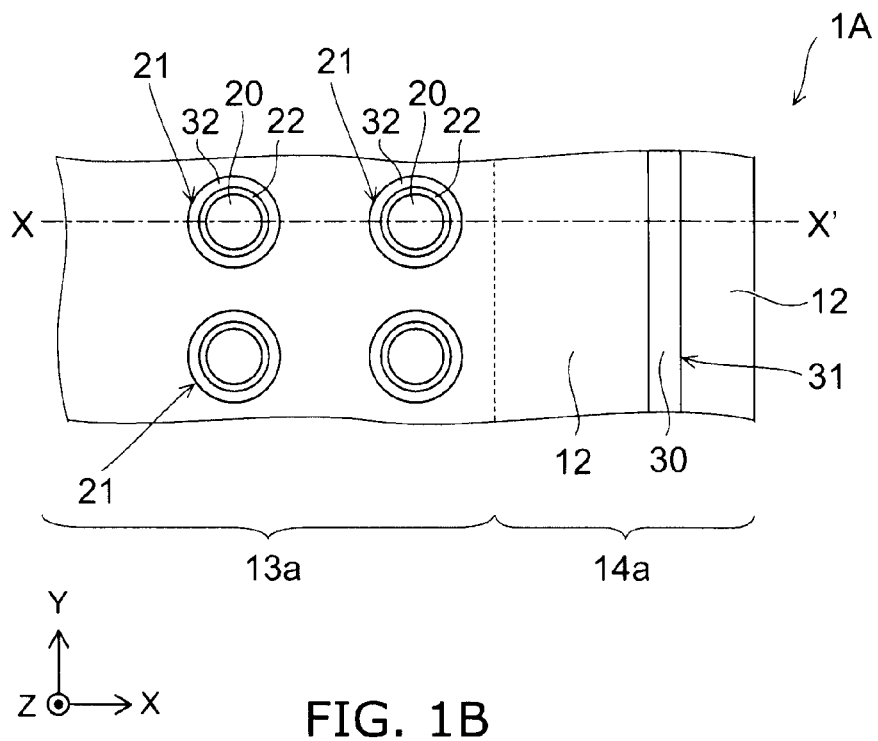

FIGS. 1A and 1B are schematic views of the chip edge region of a semiconductor chip according to a first embodiment. More specifically, FIG. 1A is a schematic sectional view of the semiconductor chip. FIG. 1B is a schematic plan view of the back surface side of the semiconductor chip.

Figure 2:
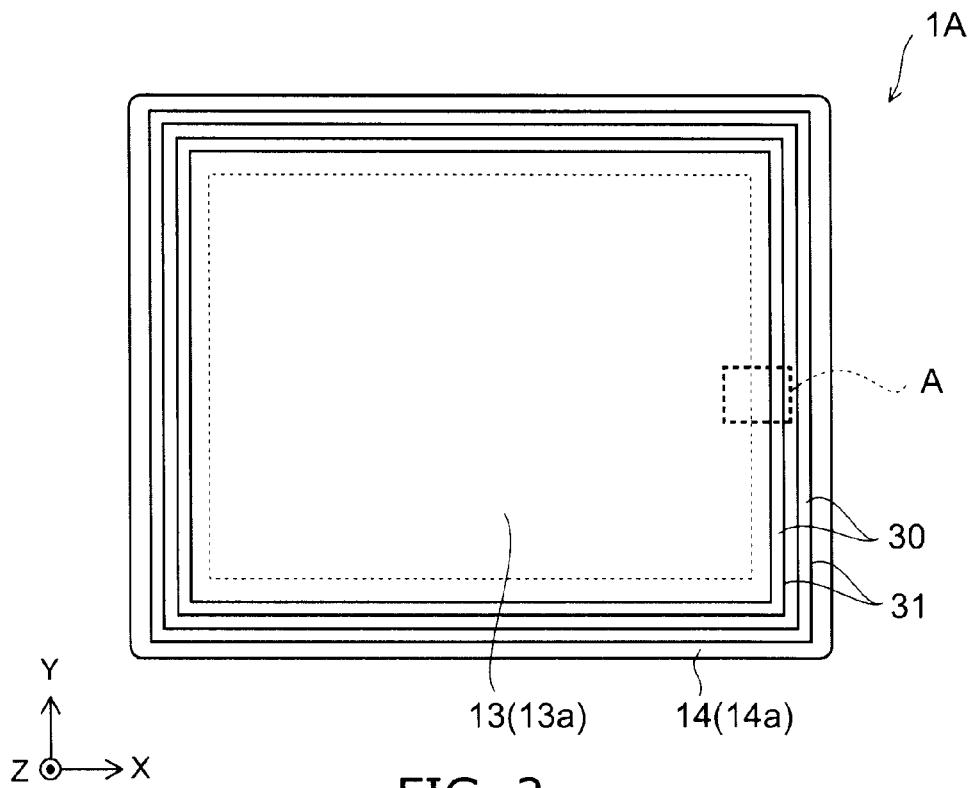
FIG. 2 is a schematic plan view of the front surface side of the entire semiconductor chip according to the first embodiment.

FIG. 2 is a schematic plan view of the front surface side of the entire semiconductor chip according to the first embodiment.

FIG. 1A shows the X-X' cross section of FIG. 1B. FIG. 1B shows an enlarged view of the portion denoted by A in FIG. 2.

The semiconductor chip 1A according to the first embodiment is housed in e.g. a multi-chip package type semiconductor device.

As shown in FIG. 1A, the semiconductor chip 1A includes a semiconductor substrate 12 having a front surface (first major surface) 10 and a back surface (second major surface) 11 on the opposite side from the front surface 10. The semiconductor substrate 12 is e.g. a thinned silicon substrate. For instance, by grinding the back surface side of a silicon substrate, the silicon substrate is thinned.

On the front surface 10 side of the semiconductor substrate 12, the semiconductor substrate 12 is provided with a circuit section 13 including elements and wirings, and a guard ring structure section 14 surrounding the circuit section 13. The circuit section 13 provided on the semiconductor substrate 12 includes e.g. active elements such as transistors and diodes, passive elements such as resistors and capacitors, wirings connecting these elements, and memory cells. Some of the active elements formed in the circuit section 13 may be formed in the semiconductor substrate 12. The wirings in the circuit section 13 are e.g. stacked via interlayer insulating films. The circuit section 13 is largely occupied by wirings.

The guard ring structure section 14 provided on the semiconductor substrate 12 includes e.g. a conductive guard ring formed in the interlayer insulating film. The guard ring structure section 14 is provided around the circuit section 13. Hence, the guard ring suppresses the occurrence of cracks in the semiconductor substrate 12 at the time of dicing, and diffusion of moisture into the circuit section 13 after dicing.

In the semiconductor chip 1A as viewed from the front surface (first major surface) 10 side or the back surface (second major surface) 11 side, the region including the circuit section 13 is referred to as circuit region 13a, and the region including the guard ring structure section 14 and surrounding the circuit region 13a is referred to as outer peripheral region 14a.

The semiconductor chip 1A further includes a via 20 in a via hole 21 extending from the front surface 10 side to the back surface 11 side of the semiconductor substrate 12. At least one via hole 21 is provided in the semiconductor substrate 12. Furthermore, the semiconductor chip 1A includes an insulating layer 30 in a first trench 31 extending from the front surface 10 side to the back surface 11 side of the semiconductor substrate 12. At least one first trench 31 is provided in the semiconductor substrate 12.

An insulating layer 32 is provided between the via 20 and the semiconductor substrate 12. The insulating layer 32 is a spacer member for maintaining insulation between the via 20 and the semiconductor substrate 12. Furthermore, a barrier metal layer 22 is provided between the insulating layer 32 and the via 20. The via 20 and the insulating layer 30 are provided in the same semiconductor substrate 12. In the first embodiment, the insulating layer 32 is a first insulating layer, and the insulating layer 30 is a second insulating layer.

In the semiconductor chip 1A as viewed in the direction perpendicular to the front surface 10 (or the back surface 11) of the semiconductor substrate 12, the via hole 21 is located in the circuit region 13a, and the first trench 31 is located in the outer peripheral region 14a surrounding the circuit region 13a (see FIG. 1B).

The width of the first trench 31 in the direction parallel to the front surface 10 of the semiconductor substrate 12 (the X direction in the figure) is narrower than the width of the via hole 21 in this parallel direction. Here, the "width" is defined as the width of the via hole 21 or the width of the first trench 31 along line X-X' of FIG. 1B. For the first trench 31, the "width" can also be defined in the direction generally perpendicular to its longitudinal direction.

In the semiconductor chip 1A as viewed in the direction perpendicular to the front surface 10 (or the back surface 11) of the semiconductor substrate 12, the first trench 31 is continuous and shaped like a loop. The circuit region 13a is surrounded with the first trench 31. Thus, the circuit region 13a of the semiconductor substrate 12 is separated by the first trench 31 from the semiconductor substrate 12 outside the first trench 31.

The first trench 31 may be a closed loop-shaped trench with no end as shown, or an open loop-shaped trench being partly discontinuous. In the semiconductor chip 1A as viewed in the direction perpendicular to the front surface 10 (or the back surface 11) of the semiconductor substrate 12, the loop-shaped first trench 31 may be onefold, or twofold or more. As an example, FIG. 2 shows a twofold first trench 31. That is, in the semiconductor substrate 12 as viewed in the direction perpendicular to the front surface 10 of the semiconductor substrate 12, outside the insulating layer 30 provided in the first trench 31, an insulating layer 30 is further provided in another first trench 31 surrounding the former first trench 31.

The semiconductor substrate 12 is composed primarily of e.g. silicon (Si). The material of the via 20 is e.g. one of copper (Cu), tungsten (W), nickel (Ni), and polysilicon. The material of the insulating layer 30, 32 is selected so that the metal diffusion length therein is shorter than the metal diffusion length in the silicon crystal. For instance, as an example of the material of the insulating layer 30, 32, at least one of silicon nitride ($Si_3N_4$), silicon carbide (SiC), silicon carbonitride (SiCN), and silicon oxide ($SiO_2$) is selected. The material of the barrier metal layer 22 is e.g. titanium (Ti) or titanium nitride (TiN).

Figure 3:
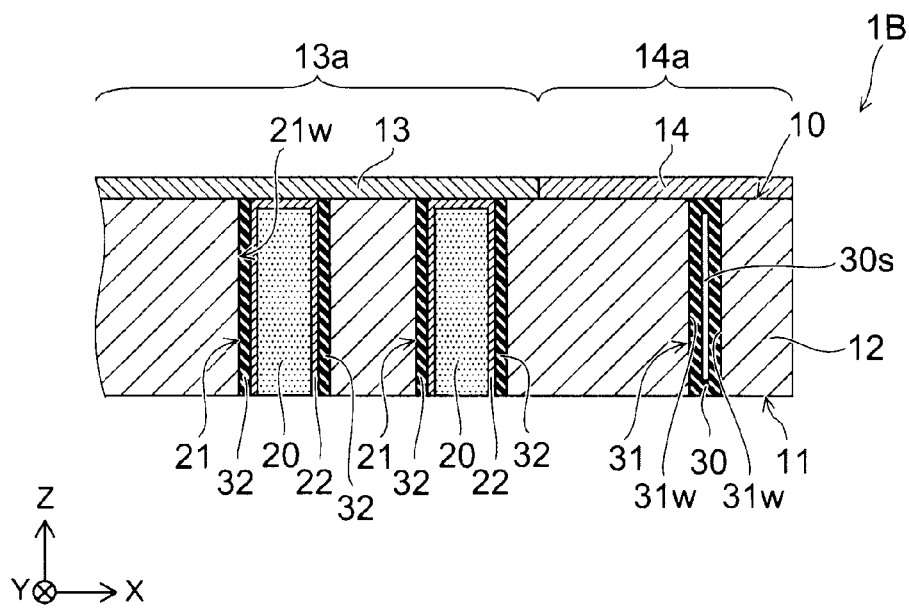
FIG. 3 is a schematic sectional view of a semiconductor chip according to a variation of the first embodiment.

FIG. 3 is a schematic sectional view of a semiconductor chip according to a variation of the first embodiment.

More specifically, FIG. 3 shows a schematic sectional view of the chip edge region of the semiconductor chip.

In the semiconductor chip 1B, a seam-like space 30s is formed at the center of the insulating layer 30 in the first trench 31. However, in the semiconductor chip 1B, the side surface 31w of the first trench 31 is covered with the insulating layer 30. The semiconductor chip 1B of such structure is also included in the first embodiment.

A process for manufacturing a semiconductor chip is described by taking a process for manufacturing the semiconductor chip 1A as an example.

Figure 4A:
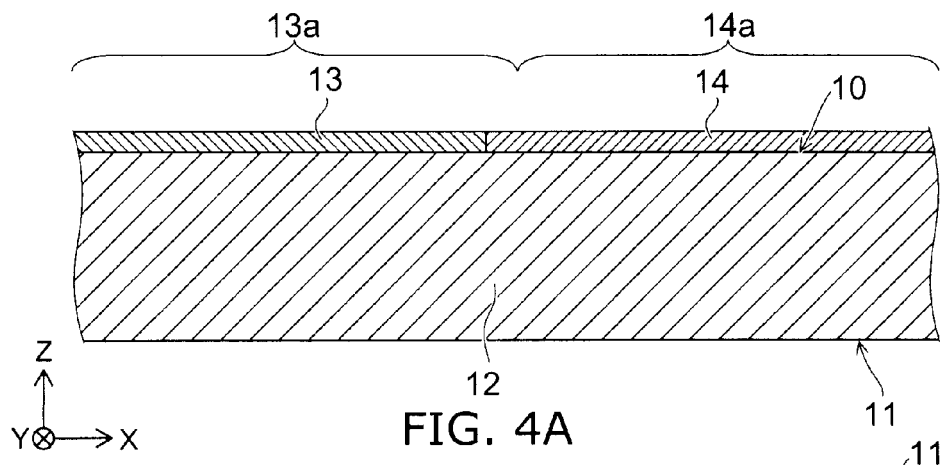
FIGS. 4A to 4C are schematic views for describing the process for manufacturing a semiconductor chip according to the first embodiment.
Figure 4B:
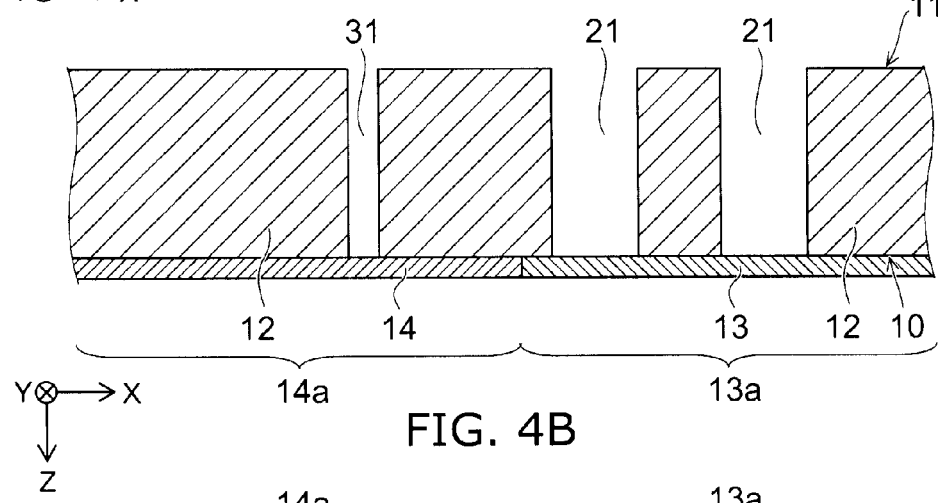
Figure 4C:
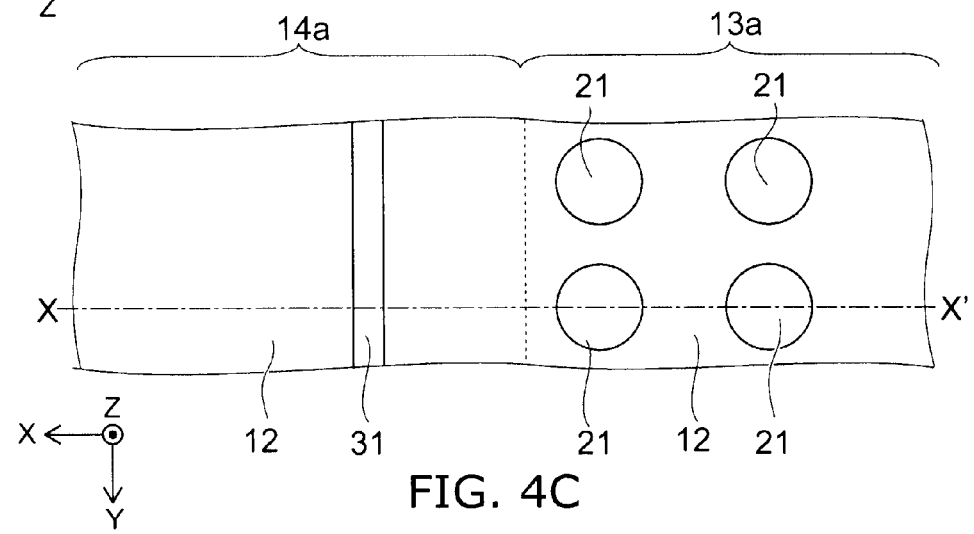

FIGS. 4A to 4C are schematic views for describing the process for manufacturing a semiconductor chip according to the first embodiment. More specifically, FIG. 4A is a schematic sectional view for describing a manufacturing process for forming a circuit section and a guard ring structure section on the front surface side of the semiconductor chip. FIG. 4B is a schematic sectional view for describing a manufacturing process for forming a via hole and a first trench of the semiconductor chip. FIG. 4C is a schematic plan view on the back surface side. FIG. 4B shows the X-X' cross section of FIG. 4C.

First, as shown in FIG. 4A, on the front surface 10 side of the semiconductor substrate 12, a circuit section 13 including elements and wirings, and a guard ring structure section 14 surrounding the circuit section 13 are formed. The semiconductor substrate 12 at this stage is in the wafer state before dicing. The semiconductor substrate 12 is thinned by grinding the back surface 11 side. The thinned semiconductor substrate 12 is supported by a support substrate such as a glass plate.

Next, the semiconductor substrate 12 is turned 180 degrees upside down. Then, as shown in FIGS. 4B and 4C, as viewed in the direction perpendicular to the front surface 10 (or the back surface 11), at least one via hole 21 is formed in the semiconductor substrate 12 of a circuit region 13a including the circuit section 13. Furthermore, at least one first trench 31 is formed in the semiconductor substrate 12 of an outer peripheral region 14a including the guard ring structure section 14 and surrounding the circuit region 13a.

At this stage, from the back surface 11 toward the front surface 10 of the semiconductor substrate 12, at least one via hole 21 opening part of the circuit section 13 to the back surface 11 side is formed. Furthermore, from the back surface 11 toward the front surface 10 of the semiconductor substrate 12, at least one first trench 31 opening part of the guard ring structure section 14 to the back surface 11 side is formed.

The via hole 21 and the first trench 31 are formed from the back surface 11 side of the semiconductor substrate 12 by e.g. the photolithography process and etching process.

The width of the first trench 31 in the direction parallel to the front surface 10 of the semiconductor substrate 12 (the X direction in the figure) is made narrower than the width of the via hole 21 in the X direction. Furthermore, as shown in FIGS. 1A and 1B, the first trench 31 is formed so as to surround the circuit region 13a.

Figure 5A:
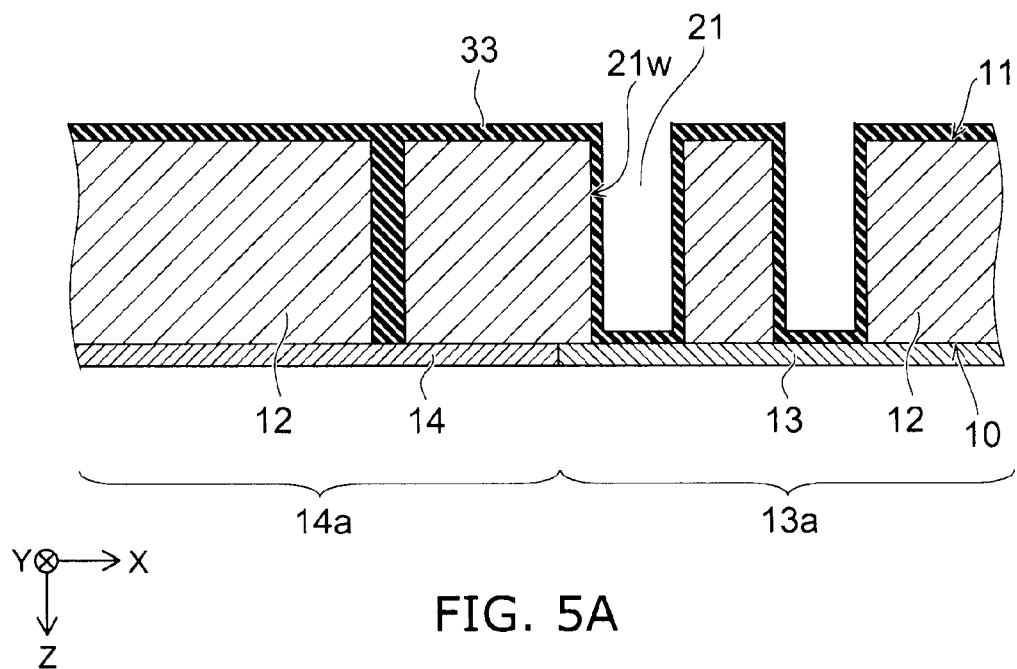
FIGS. 5A and 5B are schematic sectional views for describing the process for manufacturing a semiconductor chip according to the first embodiment.
Figure 5B:
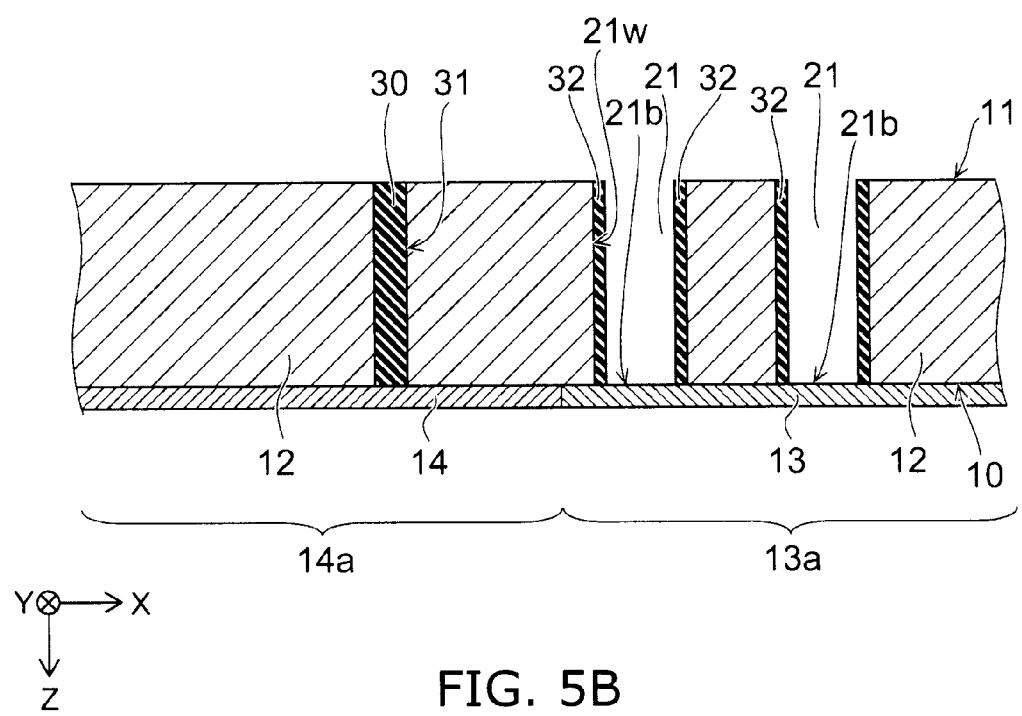

FIGS. 5A and 5B are schematic sectional views for describing the process for manufacturing a semiconductor chip according to the first embodiment. More specifically, FIG. 5A shows a manufacturing process for forming an insulating layer in the via hole and in the first trench. FIG. 5B shows a manufacturing process for etching the insulating layer in the via hole.

Next, as shown in FIG. 5A, an insulating film 33 made of the same material as the insulating layer 30, 32 is collectively formed on the back surface 11, in the via hole 21, and in the first trench 31 of the semiconductor substrate 12. The insulating film 33 is formed by e.g. plasma-enhanced CVD (chemical vapor deposition), which provides good step coverage.

Here, the width of the via hole 21 is wider than the width of the first trench 31. Hence, by appropriately adjusting the thickness of the insulating film 33, the inside of the first trench 31 is filled with the insulating film 33, whereas the inside of the via hole 21 is not filled with the insulating film 33.

For instance, after starting to collectively form an insulating film 33 on the back surface 11, in the via hole 21, and in the first trench 31 of the semiconductor substrate 12, the inside of the first trench 31 is filled with the insulating film 33. Then, film formation of the insulating film 33 is stopped. This results in a structure in which the inside of the first trench 31 is filled with the insulating film 33, whereas the inside of the via hole 21 is not filled with the insulating film 33. The thickness of the insulating film 33 formed on the side surface 21w of the via hole 21 is e.g. approximately half the width of the first trench 31.

After the insulating film 33 is formed, the insulating film 33 formed on the side surface 21w of the via hole 21 corresponds to the aforementioned insulating layer 32, and the insulating film 33 embedded in the first trench 31 corresponds to the aforementioned insulating layer 30.

Next, as shown in FIG. 5B, by anisotropic etching such as RIE (reactive ion etching), the insulating film 33 deposited on the bottom surface 21b of the via hole 21 is selectively removed. The insulating film 33 formed on the back surface 11 of the semiconductor substrate 12 is removed as necessary. Thus, the insulating layer 32 is provided on the side surface 21w of the via hole 21. Furthermore, the insulating layer 30 is provided in the first trench 31.

Figure 6A:
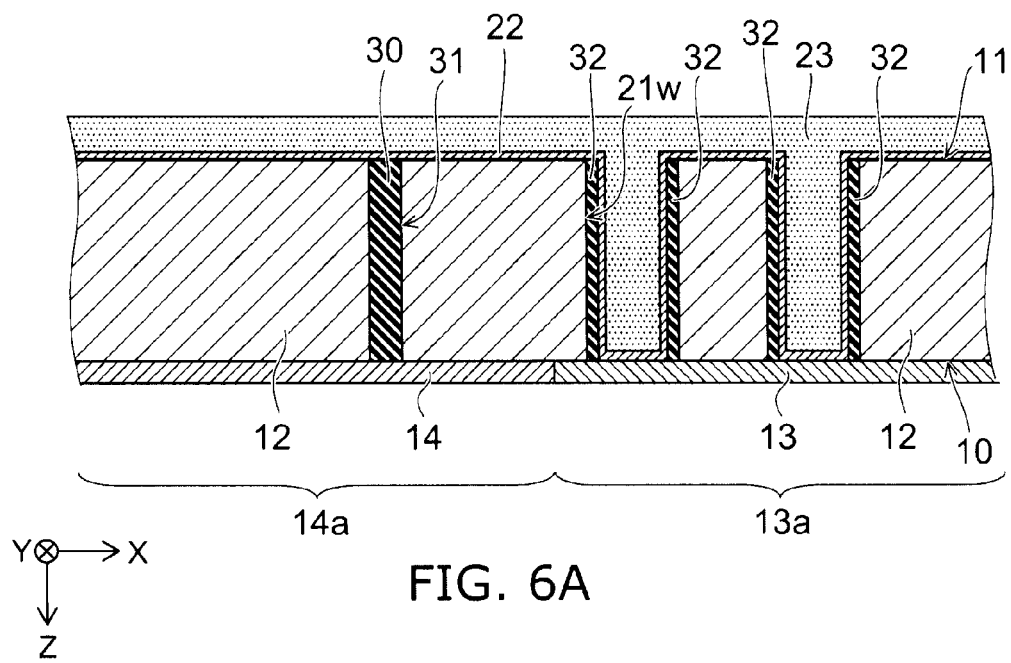
FIGS. 6A and 6B are schematic sectional views for describing the process for manufacturing a semiconductor chip according to the first embodiment.
Figure 6B:
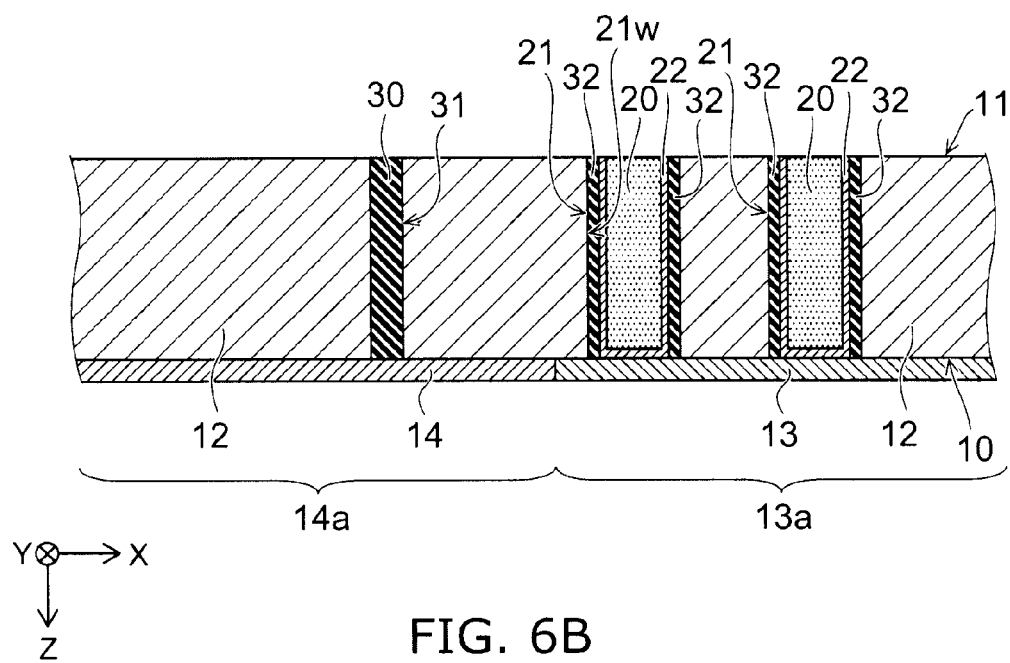

FIGS. 6A and 6B are schematic sectional views for describing the process for manufacturing a semiconductor chip according to the first embodiment. More specifically, FIG. 6A shows a manufacturing process for forming a conductive layer on the back surface and in the via hole of the semiconductor substrate. FIG. 6B shows a manufacturing process for forming a via in the via hole.

Next, as shown in FIG. 6A, on the back surface 11 and in the via hole 21 of the semiconductor substrate 12, a barrier metal layer 22 is formed by the sputtering method.

Subsequently, on the back surface 11 and in the via hole 21 of the semiconductor substrate 12, a conductive layer 23 is formed via the barrier metal layer 22. The conductive layer 23 is formed by e.g. the electrolytic plating method or CVD.

The insulating film 33 deposited on the bottom surface 21b of the via hole 21 has already been removed. Hence, the conductive layer 23 is brought into contact with the circuit section 13.

Next, as shown in FIG. 6B, the excess portion of the conductive layer 23 formed outside the via hole 21, and the excess portion of the barrier metal layer 22 formed on the back surface 11 of the semiconductor substrate 12 are removed by CMP (chemical mechanical polishing). Thus, a via 20 connected to the circuit section 13 is formed in the via hole 21.

Figure 7A:
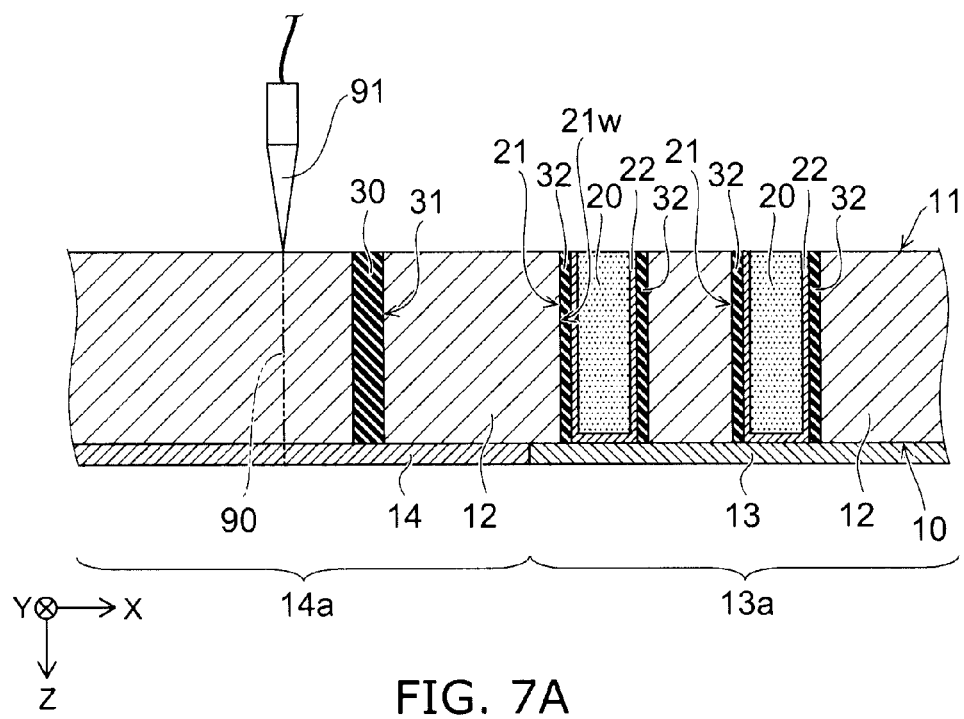
FIGS. 7A and 7B are schematic sectional views for describing the process for manufacturing a semiconductor chip according to the first embodiment.
Figure 7B:
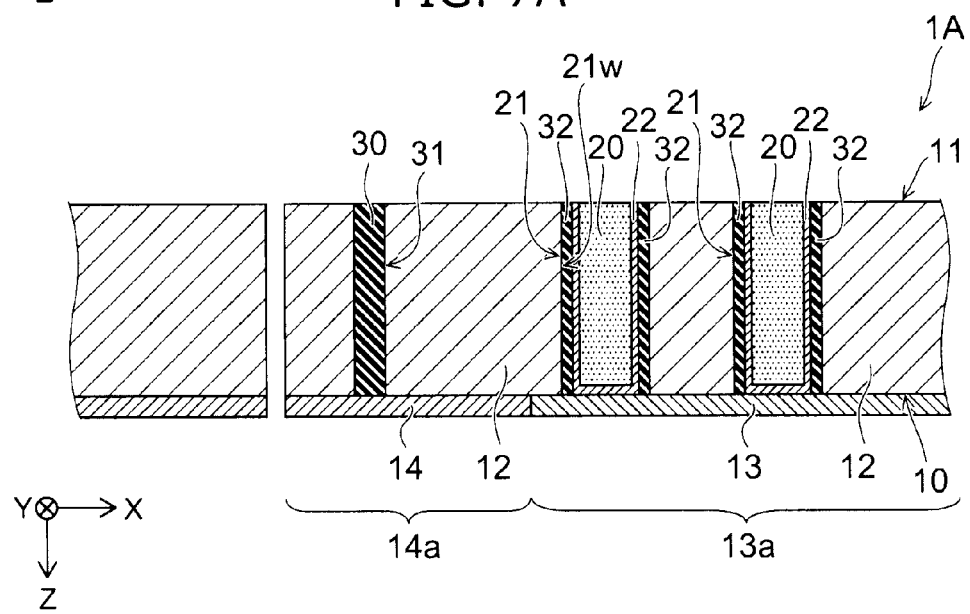

FIGS. 7A and 7B are schematic sectional views for describing the process for manufacturing a semiconductor chip according to the first embodiment. More specifically, FIG. 7A shows a manufacturing process for performing dicing processing on the semiconductor substrate. FIG. 7B shows a singulated semiconductor chip.

Next, as shown in FIG. 7A, dicing processing is performed on the semiconductor substrate 12. In the first embodiment, to prevent chipping and cracking of the semiconductor substrate 12 at the time of dicing, the semiconductor substrate 12 is divided by laser dicing. For instance, along a dicing line 90, the semiconductor substrate 12 is irradiated with laser light 91. Instead of laser dicing, plasma etching may also be used to divide the semiconductor substrate 12. Thus, the semiconductor substrate 12 is singulated into semiconductor chips 1A. This state is shown in FIG. 7B.

Subsequently, a plurality of the singulated semiconductor chips 1A are stacked and sealed with a sealing resin. Thus, a multi-chip package type semiconductor device is formed (described later). In the case where a thermosetting resin is used as the sealing resin, the semiconductor chips 1A are heated when the semiconductor chips 1A are sealed.

Depending on the film formation condition, the aforementioned seam-like space 30s may be produced in the insulating layer 30. In this case, instead of the semiconductor chip 1A, a semiconductor chip 1B is formed.

Figure 8A:
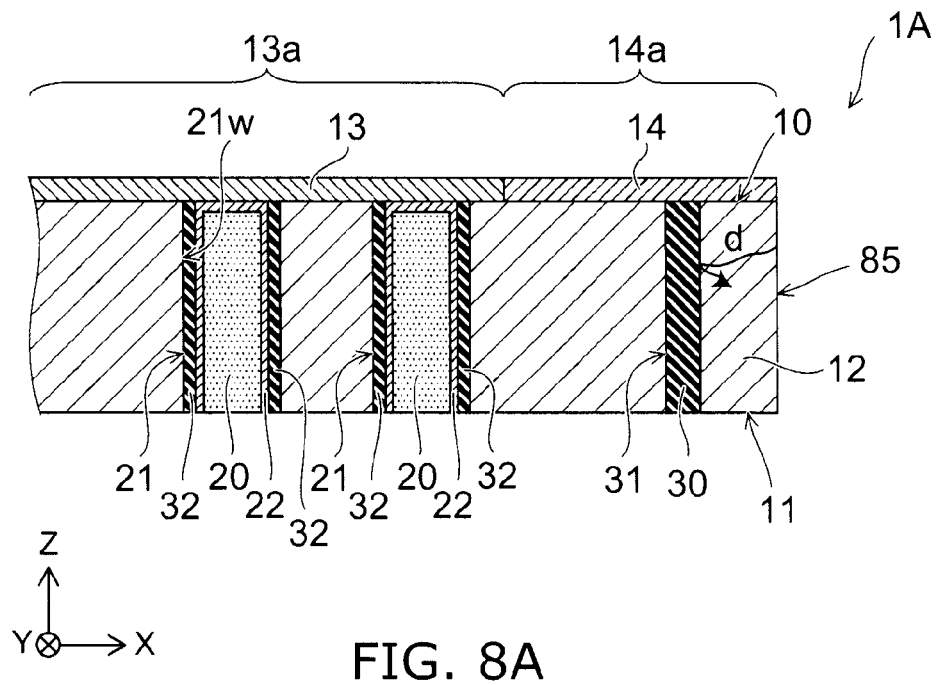
FIG. 8A is a schematic sectional view for describing the function of the semiconductor chip according to the first embodiment.
Figure 8B:
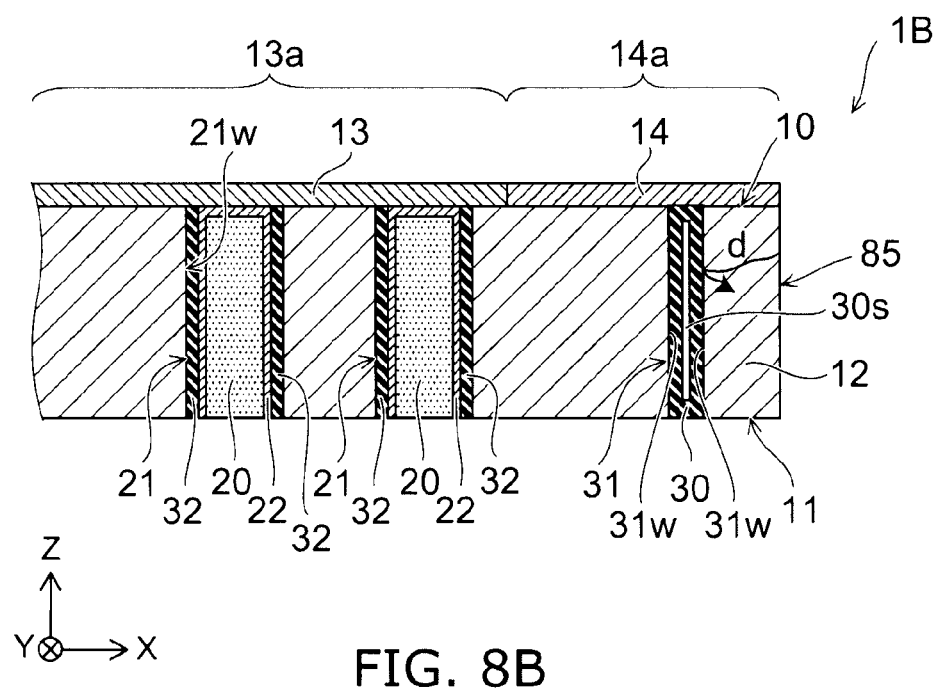
FIG. 8B is a schematic sectional view for describing the function of the semiconductor chip according to the first embodiment.

FIGS. 8A and 8B are schematic sectional views for describing the function of the semiconductor chip according to the first embodiment.

FIG. 8A shows the semiconductor chip 1A. FIG. 8B shows the semiconductor chip 1B.

In the semiconductor chip 1A, 1B, the circuit section 13 is surrounded with the ring-shaped first trench 31. In the semiconductor chip 1A, the insulating layer 30 is provided in the trench 31. In the semiconductor chip 1B, the side surface 31w of the first trench 31 is covered with the insulating layer 30.

The guard ring structure section 14 includes a metallic guard ring. Thus, if the semiconductor substrate 12 is cut along the dicing line 90, the metal component of the guard ring may be attached to the cut surface 85. The attached metal may act as a contaminating metal source.

The cut surface 85 is formed by laser dicing or plasma etching. This cutting is not the mechanical dicing processing using a dicing blade. Hence, the cut surface 85 is formed as a relatively smooth surface. Thus, the cut surface 85 may fail to have a sufficient function for gettering contaminating metal. Then, as described above, the metal component in the guard ring may be attached to this cut surface 85.

However, in the semiconductor chip 1A, 1B, after dicing, even if the semiconductor chip is heated or the temperature of the semiconductor chip itself is increased, the insulating layer 30 suppresses thermal diffusion of contaminating metal into the semiconductor chip. More specifically, diffusion of contaminating metal is shown by arrow d. As shown by this arrow d, the insulating layer 30 serves as a barrier layer to suppress thermal diffusion of contaminating metal into the semiconductor chip. Thus, in the semiconductor chip 1A, 1B, characteristics degradation and reliability degradation are less likely to occur.

Furthermore, the material of the insulating layer 30 is at least one of silicon nitride ($Si_3N_4$), silicon carbide (SiC), silicon carbonitride (SiCN), and silicon oxide ($SiO_2$). The linear expansion coefficient of such materials is smaller than the linear expansion coefficient of the material constituting the via 20 (e.g., copper (Cu)).

If a metal layer made of e.g. copper (Cu) is embedded in the first trench 31, the difference between the linear expansion coefficient of the metal layer and the linear expansion coefficient of the semiconductor substrate 12 is made large. Thus, when the semiconductor chips are stacked or sealed with a sealing resin, an excessive stress is applied to the semiconductor chip. This generates cracks in the semiconductor chip or deforms the semiconductor chip itself.

In contrast, in the semiconductor chip 1A, 1B, the insulating layer 30 is provided in the first trench 31. The difference between the linear expansion coefficient of the insulating layer 30 and the linear expansion coefficient of the semiconductor substrate 12 is smaller than the difference between the linear expansion coefficient of the metal layer and the linear expansion coefficient of the semiconductor substrate 12. Thus, when the semiconductor chips 1A, 1B are stacked or sealed with a sealing resin, the stress is relaxed. Hence, the semiconductor chip 1A, 1B is less prone to cracks. Furthermore, the semiconductor chip 1A, 1B is less prone to deformation.

In the semiconductor chip 1A, 1B, the insulating layer 30 is formed in the first trench 31 at the same time as the insulating layer 32 is formed on the side surface 21w in the via hole 21. This can be achieved because the width of the first trench 31 is narrower than the width of the via hole 21.

In other words, in the semiconductor chip 1A, 1B, the ratio of the area of the insulating layer 30 to the entire chip area can be made lower. As a result, in the semiconductor chip 1A, 1B, the area ratio of the circuit section 13 can be increased.

If the inside of the first trench 31 is filled with a metal layer, a barrier metal layer is needed between this metal layer and the first trench 31. This barrier metal layer is a necessary member for preventing the metal component in the metal layer from diffusing into the semiconductor substrate. Hence, the width of the first trench 31 is inevitably made wider. This limits the increase of the area ratio of the circuit section 13. On the other hand, the metal layer in the first trench 31 may be degraded by moisture absorbed from outside the chip. As a result, the metal layer itself in the first trench 31 may act as a contaminating metal source.

In contrast, in the semiconductor chip 1A, 1B, the insulating layer 30 is formed in the first trench 31. Thus, the material in the first trench 31 does not act as a contaminating metal source.

Thus, according to the first embodiment, a semiconductor chip with good characteristics and high reliability is formed.

Second Embodiment

Figure 9A:
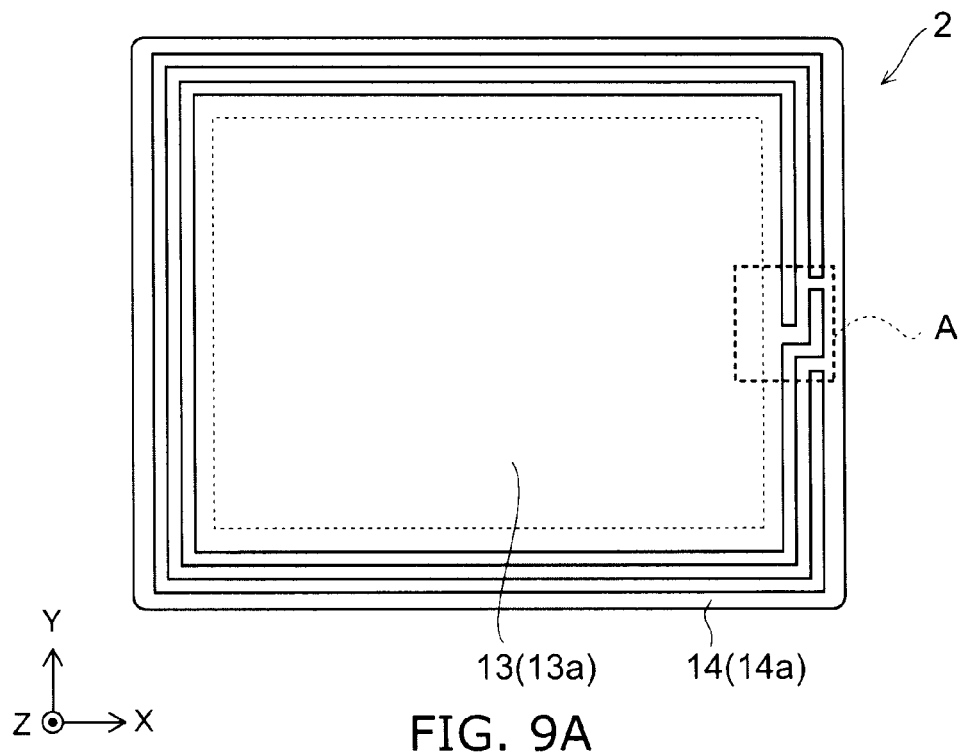
FIGS. 9A and 9B are schematic plan views of the back surface side of the chip edge region of a semiconductor chip according to a second embodiment.
Figure 9B:
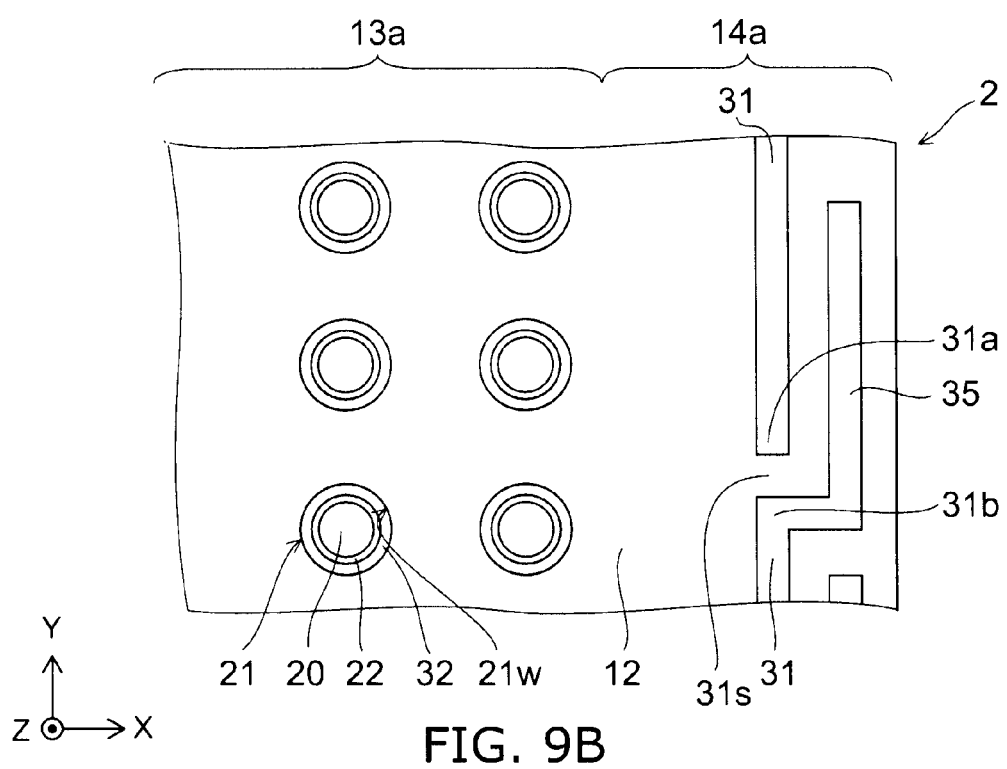

FIGS. 9A and 9B are schematic plan views of the back surface side of the chip edge region of a semiconductor chip according to a second embodiment. More specifically, FIG. 9A is an entire view of the back surface side of the semiconductor chip. FIG. 9B is an enlarged view of portion A of FIG. 9A.

In the semiconductor chip 2 as viewed in the direction perpendicular to the front surface 10 of the semiconductor substrate 12, the semiconductor substrate 12 of the outer peripheral region 14a includes a portion 31s where the semiconductor substrate 12 on the circuit region 13a side and the semiconductor substrate 12 on the opposite side from the circuit region 13a are connected across the first trench 31. That is, in the semiconductor chip 2, the first trench 31 surrounding the circuit region 13a is discontinuous. This discontinuous portion constitutes the portion 31s.

In the semiconductor chip 2, the portion 31s is sandwiched between the first end 31a of the first trench 31 and the second end 31b of the first trench 31. In the portion 31s, the first end 31a of the first trench 31 and the second end 31b of the first trench 31 are opposed to each other. In the semiconductor chip 2, a second trench 35 further extends from the first end 31a or the second end 31b. The first trench 31 and the second trench 35 are opposed to each other across the semiconductor substrate 12. Outside the first trench 31, the second trench 35 extending from the first end 31a or the second end 31b is further located. In the second trench, an insulating layer 30 is provided.

For instance, FIG. 9B shows the case where the second trench 35 extending from the second end 31b is provided in the semiconductor substrate 12 on the opposite side of the first trench 31 from the semiconductor substrate 12 on the circuit region 13a side. The first trench 31 and the second trench 35 extend generally in parallel.

Alternatively, the second trench 35 may extend from the first end 31a. Furthermore, the second trench 35 may be provided in the semiconductor substrate 12 on the circuit region 13a side of the first trench 31.

In such structure of the semiconductor chip 2, as viewed from the outer peripheral region 14a to the circuit region 13a, the portion 31s is shielded by the second trench 35. That is, even if part of the first trench 31 is discontinuous, the diffusion path of contaminating metal is lengthened like a maze by the presence of the second trench 35. Hence, the semiconductor chip 2 has high barrier performance against contaminating metal. Here, the site denoted by A is not limited to one site, but may be a plurality of sites.

Furthermore, the semiconductor chip 2 includes a portion where the semiconductor substrate 12 is continuous from the circuit region 13a side of the first trench 31 through the portion 31s to the outside of the first trench 31. This further increases the strength of the outer peripheral region 14a of the semiconductor chip 2.

Third Embodiment

FIGS. 10A to 10C are schematic sectional views of the chip edge region of a semiconductor chip according to a third embodiment. More specifically, FIG. 10A is a schematic sectional view of the state after the semiconductor chip is formed. FIG. 10B shows a manufacturing process for forming an insulating layer in the via hole and in the first trench. FIG. 10C shows a manufacturing process for forming a barrier metal layer in the via hole and in the first trench.

In the semiconductor chip 3 shown in FIG. 10A, a barrier metal layer 25 is further inserted into the insulating layer 30. That is, the barrier metal layer 25 is sandwiched by the insulating layer 30. In the semiconductor chip 3, the width of the first trench 31 is made wider than that of the first trench 31 of the semiconductor chip 1A. Then, in the first trench 31, an insulating layer 30 and a barrier metal layer 25 are embedded. In other words, in the first trench 31, a stacked film of insulating layer 30/barrier metal layer 25/insulating layer 30 is formed in the X direction. The material of the barrier metal layer 25 is e.g. titanium (Ti).

The process for manufacturing the semiconductor chip 3 is performed in the following procedure.

For instance, as shown in FIG. 10B, an insulating layer 32 is formed on the side surface 21w of the via hole 21. An insulating layer 30 is formed in the first trench 31. Here, formation of the insulating film 33 is stopped in the state in which the inside of the first trench 31 is not filled with the second insulating layer 30.

Next, as shown in FIG. 10C, in the via hole 21, a barrier metal layer 22 is formed via the insulating layer 32. In the first trench 31, a barrier metal layer 25 is formed via the insulating layer 30. Subsequently, the manufacturing process described with reference to FIG. 6A and the following is performed. Thus, the semiconductor chip 3 is formed.

In such structure, in the first trench 31, the barrier metal layer 25 is provided besides the insulating layer 30. This further improves the barrier performance against contaminating metal. Furthermore, the width of the first trench 31 is made wider. This increases the freedom of choice of the type of the insulating layer 30, and the freedom of choice of the film thickness of the insulating layer 30.

Fourth Embodiment

Figure 11A:
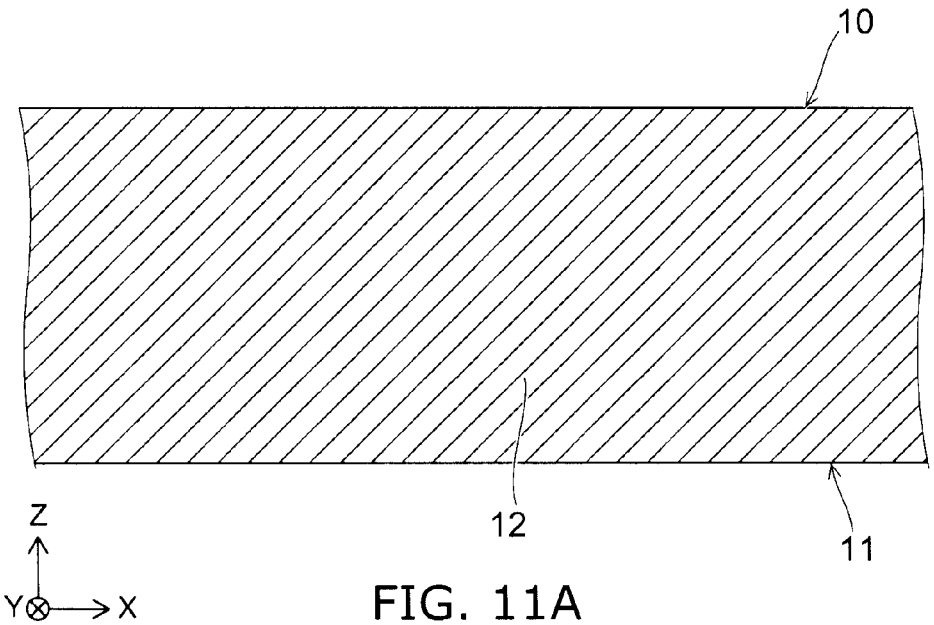
FIGS. 11A and 11B are schematic sectional views for describing a process for manufacturing a semiconductor chip according to a fourth embodiment.
Figure 11B:
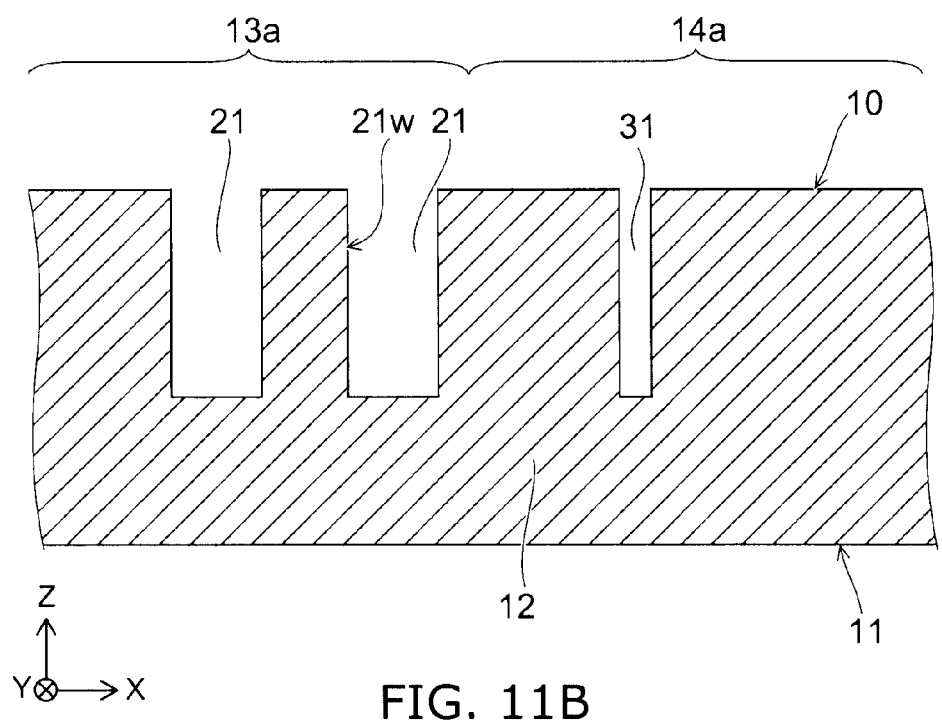

FIGS. 11A and 11B are schematic sectional views for describing a process for manufacturing a semiconductor chip according to a fourth embodiment. More specifically, FIG. 11A shows a manufacturing process for preparing a semiconductor substrate. FIG. 11B shows a manufacturing process for forming a via hole and a first trench in the semiconductor substrate.

As shown in FIG. 11A, a semiconductor substrate 12 having a front surface 10 and a back surface 11 on the opposite side from the front surface 10 is prepared. The semiconductor substrate 12 is in the wafer state before dicing.

Next, as shown in FIG. 11B, in a circuit region 13a formed on the front surface 10 side of the semiconductor substrate 12, at least one via hole 21 is formed in the semiconductor substrate 12 from the front surface 10 toward the back surface 11. Furthermore, in an outer peripheral region 14a surrounding the circuit region 13a, at least one first trench 31 is formed in the semiconductor substrate 12 from the front surface 10 toward the back surface 11. The via hole 21 and the first trench 31 are formed by e.g. the photolithography process and etching process. The width of the first trench 31 in the direction parallel to the front surface 10 (X direction) is made narrower than the width of the via hole 21 in the direction parallel to the front surface 10. The first trench 31 is formed so as to surround the circuit region 13a.

Figure 12A:
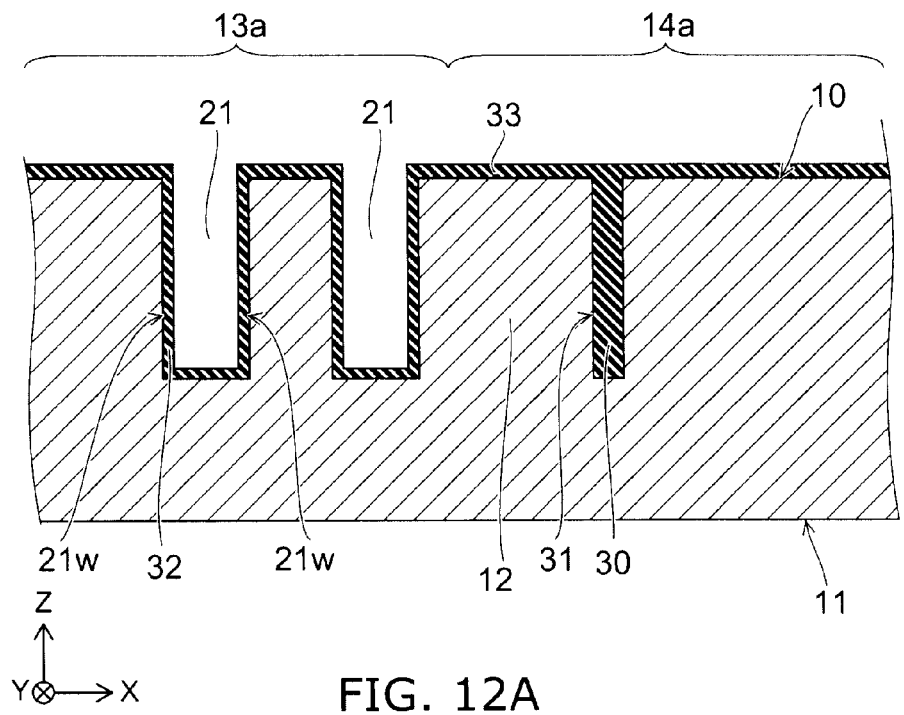
FIGS. 12A and 12B are schematic sectional views for describing the process for manufacturing a semiconductor chip according to the fourth embodiment.
Figure 12B:
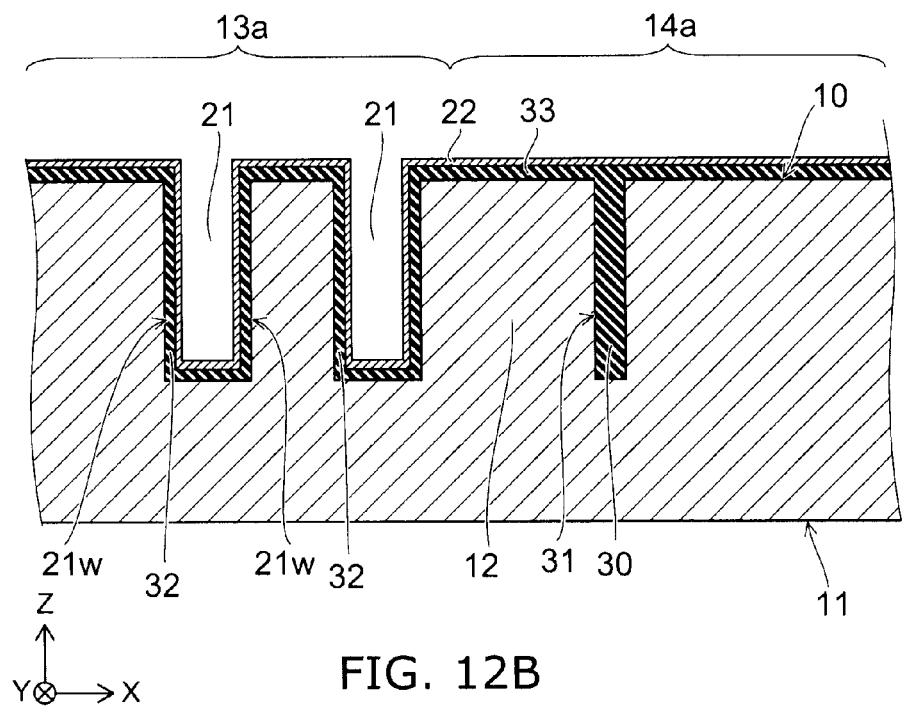

FIGS. 12A and 12B are schematic sectional views for describing the process for manufacturing a semiconductor chip according to the fourth embodiment. More specifically, FIG. 12A shows a manufacturing process for forming an insulating layer in the via hole and in the first trench. FIG. 12B shows a manufacturing process for forming a barrier metal layer in the via hole.

Next, as shown in FIG. 12A, an insulating film 33 made of the same material as the insulating layer 30, 32 is collectively formed by plasma-enhanced CVD on the front surface 10, in the via hole 21, and in the first trench 31 of the semiconductor substrate 12.

Here, the width of the via hole 21 is wider than the width of the first trench 31. Hence, by appropriately adjusting the thickness of the insulating film 33, the inside of the first trench 31 is filled with the insulating film 33, whereas the inside of the via hole 21 is not filled with the insulating film 33.

For instance, after starting to collectively form an insulating film 33 on the front surface 10, in the via hole 21, and in the first trench 31 of the semiconductor substrate 12, the inside of the first trench 31 is filled with the insulating film 33. Then, film formation of the insulating film 33 is stopped. This results in a structure in which the inside of the first trench 31 is filled with the insulating film 33, whereas the inside of the via hole 21 is not filled with the insulating film 33. The thickness of the insulating film 33 formed on the side surface 21w of the via hole 21 is approximately half the width of the first trench 31.

After the insulating film 33 is formed, the insulating film 33 formed on the side surface 21w of the via hole 21 corresponds to the aforementioned insulating layer 32, and the insulating film 33 embedded in the first trench 31 corresponds to the aforementioned insulating layer 30. That is, the insulating layer 32 is formed on the side surface 21w of the via hole 21, and the insulating layer 30 is formed in the first trench 31.

Next, as shown in FIG. 12B, on the front surface 10 and in the via hole 21 of the semiconductor substrate 12, a barrier metal layer 22 is formed by the sputtering method.

Figure 13A:
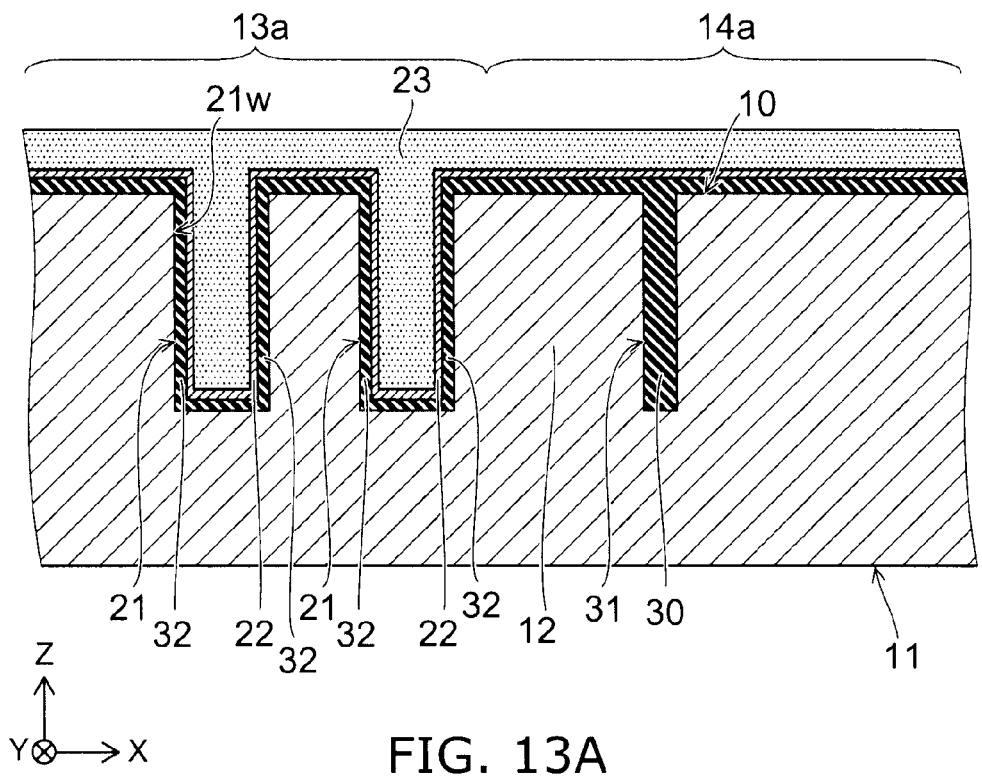
FIGS. 13A and 13B are schematic sectional views for describing the process for manufacturing a semiconductor chip according to the fourth embodiment.
Figure 13B:
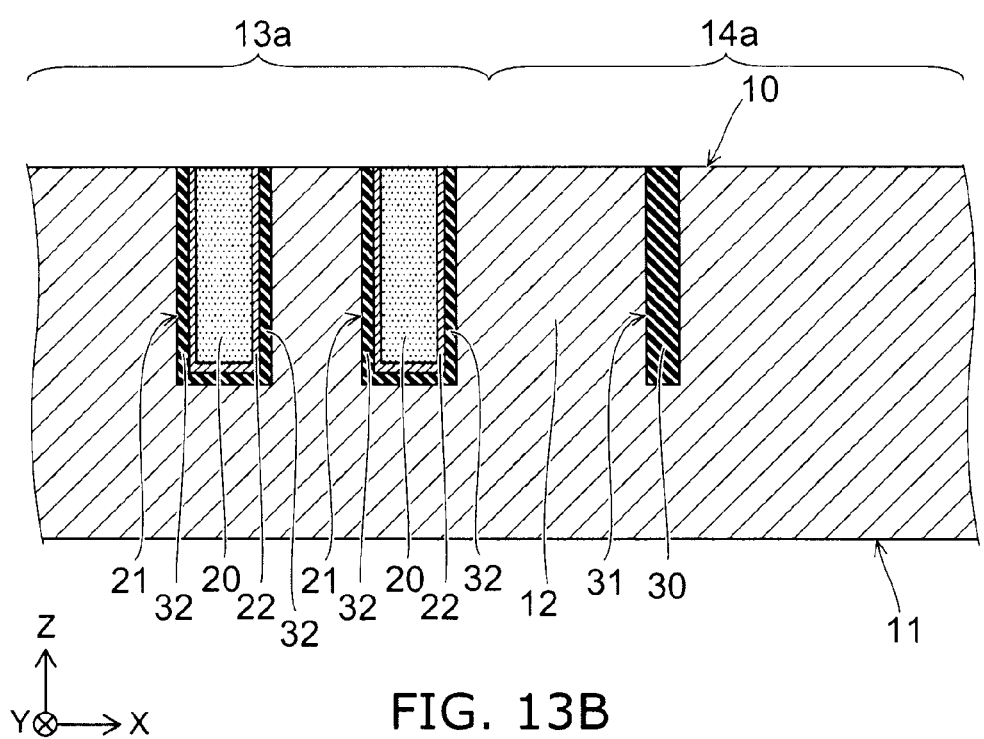

FIGS. 13A and 13B are schematic sectional views for describing the process for manufacturing a semiconductor chip according to the fourth embodiment. More specifically, FIG. 13A shows a manufacturing process for forming a conductive layer in the via hole and on the front surface side of the semiconductor substrate. FIG. 13B shows a manufacturing process for forming a via in the via hole.

Next, as shown in FIG. 13A, on the front surface 10 and in the via hole 21 of the semiconductor substrate 12, a conductive layer 23 is formed via the barrier metal layer 22. The conductive layer 23 is formed by e.g. the electrolytic plating method or CVD.

Next, as shown in FIG. 13B, the excess portion of the conductive layer 23 formed outside the via hole 21, and the excess portion of the barrier metal layer 22 formed on the front surface 10 of the semiconductor substrate 12 are removed by CMP. Thus, a via 20 connectable to the circuit section 13 is formed in the via hole 21.

Figure 14A:
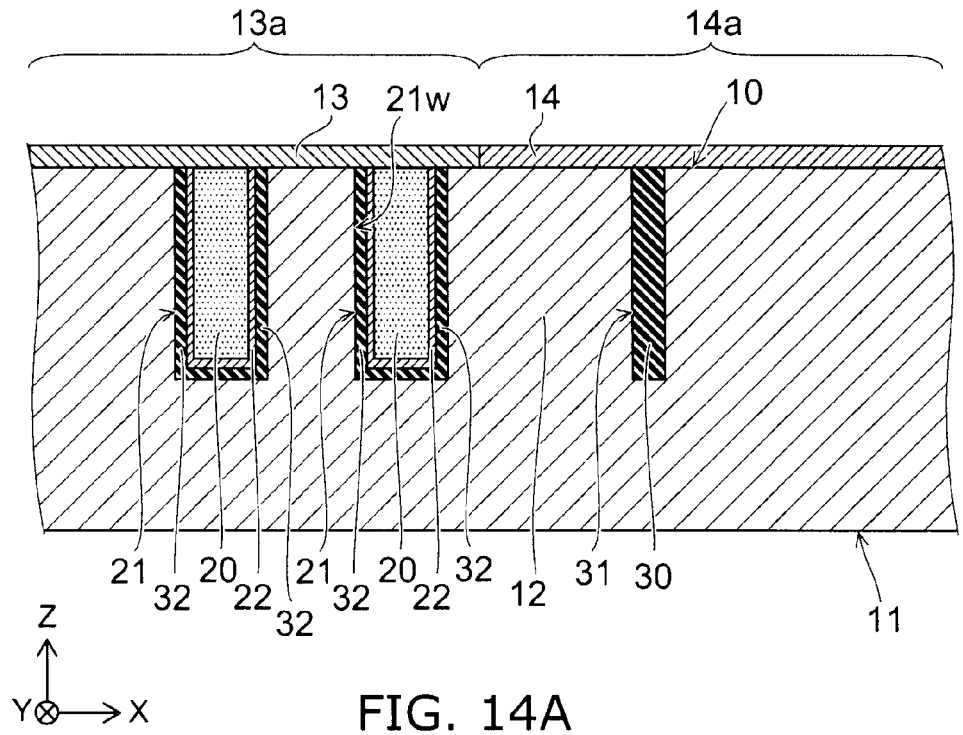
FIGS. 14A and 14B are schematic sectional views for describing the process for manufacturing a semiconductor chip according to the fourth embodiment.
Figure 14B:
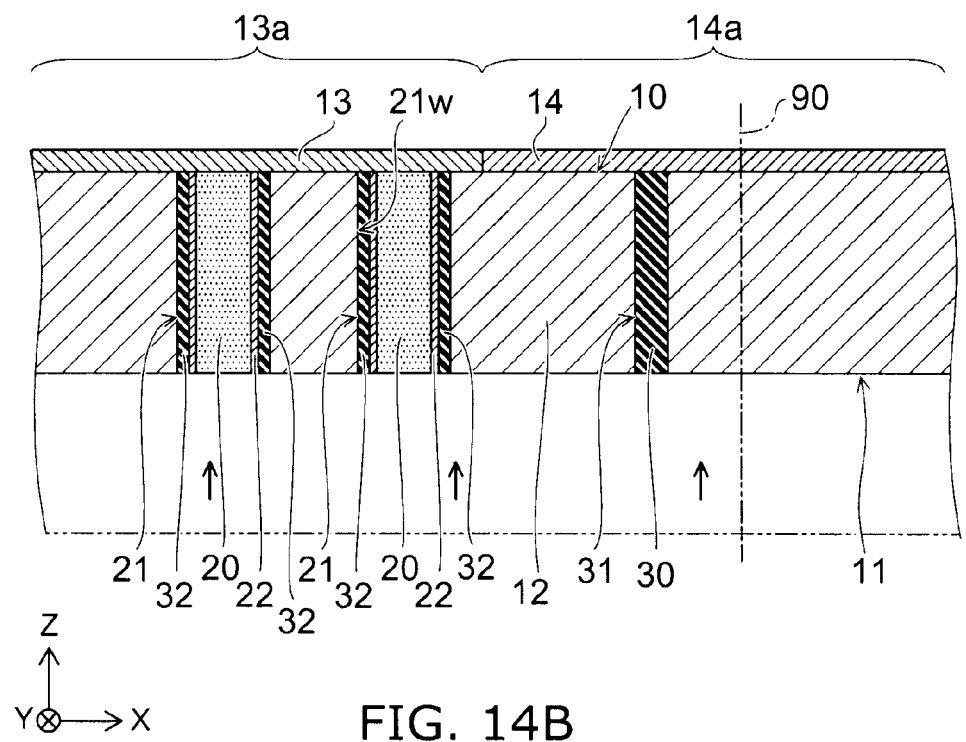

FIGS. 14A and 14B are schematic sectional views for describing the process for manufacturing a semiconductor chip according to the fourth embodiment. More specifically, FIG. 14A shows a manufacturing process for forming an element section and a guard ring structure section on the front surface side of the semiconductor substrate. FIG. 14B shows a manufacturing process for grinding the back surface side of the semiconductor substrate.

Next, as shown in FIG. 14A, a circuit section 13 including elements and wirings is formed in the circuit region 13a on the front surface 10 side of the semiconductor substrate 12. A guard ring structure section is formed in the outer peripheral region 14a.

Next, as shown in FIG. 14B, the semiconductor substrate 12 is ground on the back surface 11 side to expose the via 20 and the insulating layer 30 from the back surface 11.

Subsequently, the semiconductor substrate 12 is singulated along a dicing line 90. Also by such a manufacturing process, the semiconductor chip 1A can be formed.

Fifth Embodiment

Figure 15A:
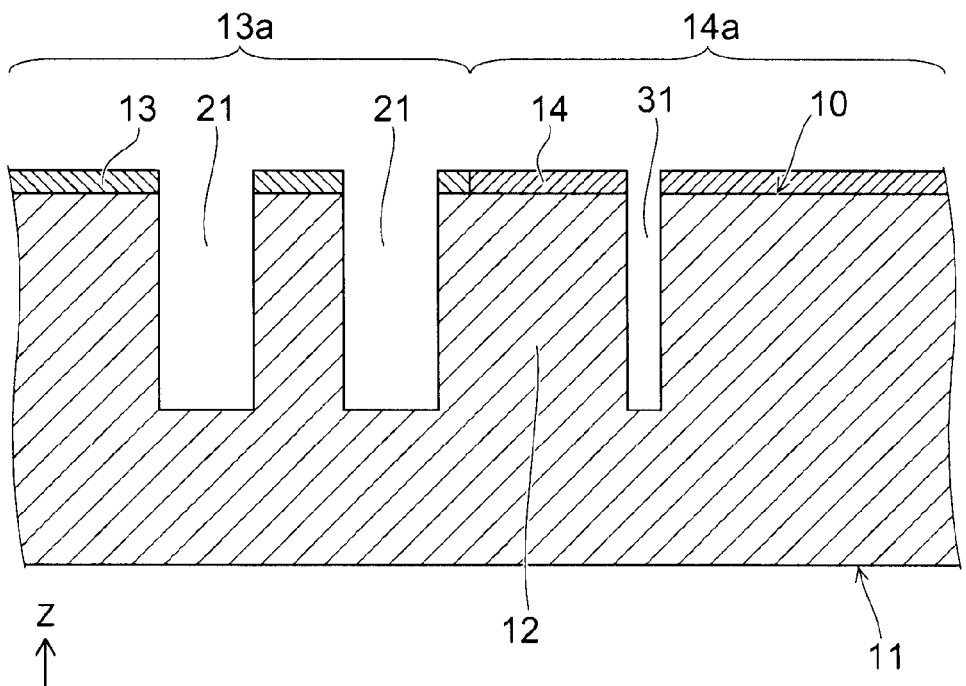
FIGS. 15A and 15B are schematic sectional views for describing a process for manufacturing a semiconductor chip according to a fifth embodiment.
Figure 15B:
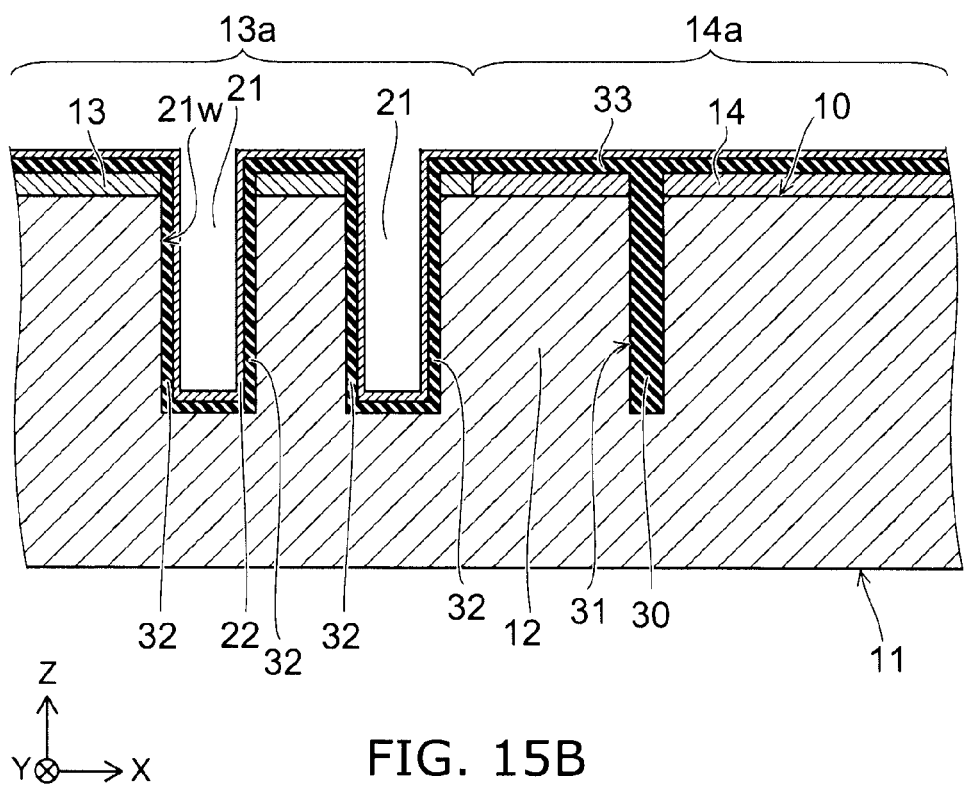

FIGS. 15A and 15B are schematic sectional views for describing a process for manufacturing a semiconductor chip according to a fifth embodiment. More specifically, FIG. 15A shows a manufacturing process for forming a via hole and a first trench in the semiconductor substrate. FIG. 15B shows a manufacturing process for forming an insulating layer in the via hole and in the first trench.

As shown in FIG. 15A, a semiconductor substrate 12 including a circuit section 13 and a guard ring structure section 14 surrounding the circuit section 13 on the front surface 10 side is prepared. Then, at least one via hole 21 is formed from the front surface 10 toward the back surface 11 of the semiconductor substrate 12. The via hole 21 penetrates to a portion of the circuit section 13 and extends into the semiconductor substrate 12 below the portion of the circuit section 13. Furthermore, at least one first trench 31 is formed. The first trench 31 penetrates to a portion of the guard ring structure section 14 and extends into the semiconductor substrate 12 below the portion of the guard ring structure section 14.

The via hole 21 and the first trench 31 are formed from the front surface 10 side of the semiconductor substrate 12 by e.g. the photolithography process and etching process. The width of the first trench 31 in the direction parallel to the front surface 10 of the semiconductor substrate 12 (the X direction in the figure) is made narrower than the width of the via hole 21 in the X direction. Furthermore, the first trench 31 is formed so as to surround the circuit region 13a.

Next, as shown in FIG. 15B, an insulating film 33 made of the same material as the insulating layer 30, 32 is collectively formed by plasma-enhanced CVD on the front surface 10, in the via hole 21, and in the first trench 31 of the semiconductor substrate 12.

Here, the width of the via hole 21 is wider than the width of the first trench 31. Hence, by appropriately adjusting the thickness of the insulating film 33, the inside of the first trench 31 is filled with the insulating film 33, whereas the inside of the via hole 21 is not filled with the insulating film 33.

For instance, after starting to collectively form an insulating film 33 on the front surface 10, in the via hole 21, and in the first trench 31 of the semiconductor substrate 12, the inside of the first trench 31 is filled with the insulating film 33. Then, film formation of the insulating film 33 is stopped. This results in a structure in which the inside of the first trench 31 is filled with the insulating film 33, whereas the inside of the via hole 21 is not filled with the insulating film 33. The thickness of the insulating film 33 formed on the side surface 21w of the via hole 21 is approximately half the width of the first trench 31.

After the insulating film 33 is formed, the insulating film 33 formed on the side surface 21w of the via hole 21 corresponds to the aforementioned insulating layer 32, and the insulating film 33 embedded in the first trench 31 corresponds to the aforementioned insulating layer 30. That is, the insulating layer 32 is formed on the side surface 21w of the via hole 21, and the insulating layer 30 is formed in the first trench 31.

Next, on the front surface 10 and in the via hole 21 of the semiconductor substrate 12, a barrier metal layer 22 is formed by the sputtering method.

Figure 16A:
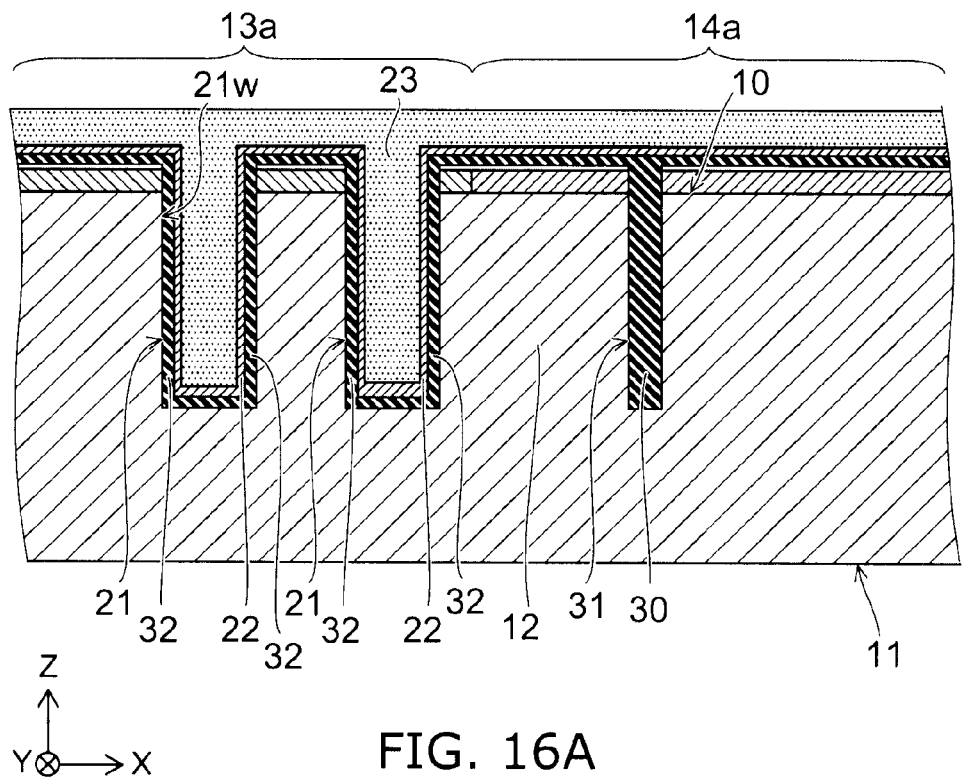
FIGS. 16A and 16B are schematic sectional views for describing the process for manufacturing a semiconductor chip according to the fifth embodiment.
Figure 16B:
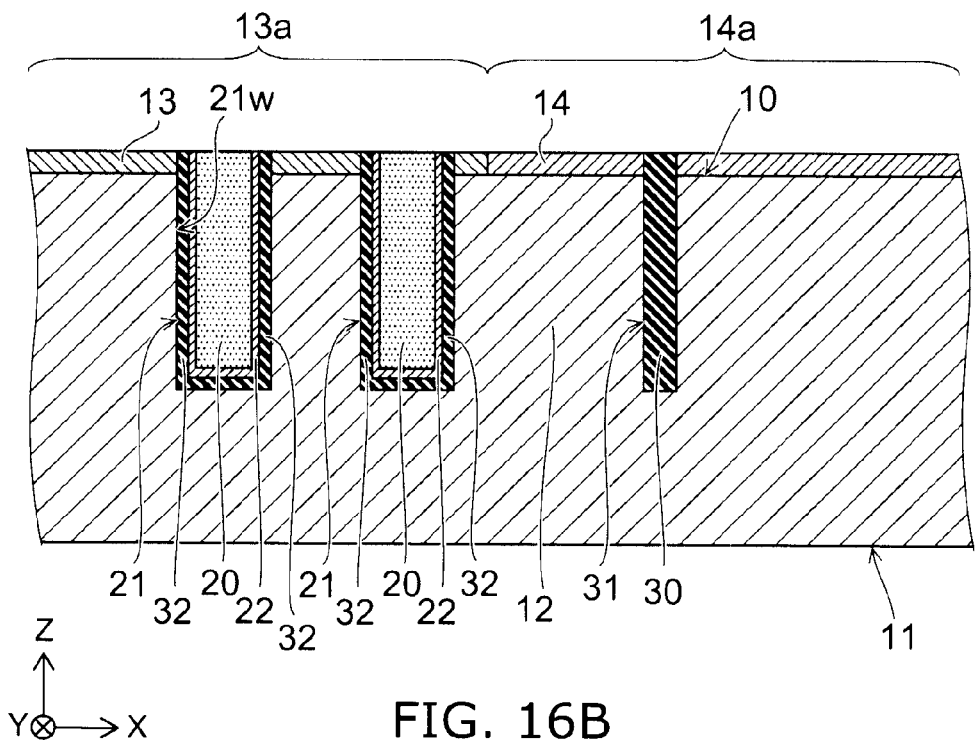

FIGS. 16A and 16B are schematic sectional views for describing the process for manufacturing a semiconductor chip according to the fifth embodiment. More specifically, FIG. 16A shows a manufacturing process for forming a conductive layer in the via hole and on the front surface side of the semiconductor substrate. FIG. 16B shows a manufacturing process for forming a via in the via hole.

Next, as shown in FIG. 16A, on the front surface 10 and in the via hole 21 of the semiconductor substrate 12, a conductive layer 23 is formed via the barrier metal layer 22. The conductive layer 23 is formed by e.g. the electrolytic plating method or CVD.

Next, as shown in FIG. 16B, the excess portion of the conductive layer 23 formed outside the via hole 21, and the excess portion of the barrier metal layer 22 formed on the front surface 10 of the semiconductor substrate 12 are removed by CMP. Thus, a via 20 connected to the circuit section 13 is formed in the via hole 21. Alternatively, the circuit section 13 and the via 20 may be connected separately by a connection wiring.

Figure 17:
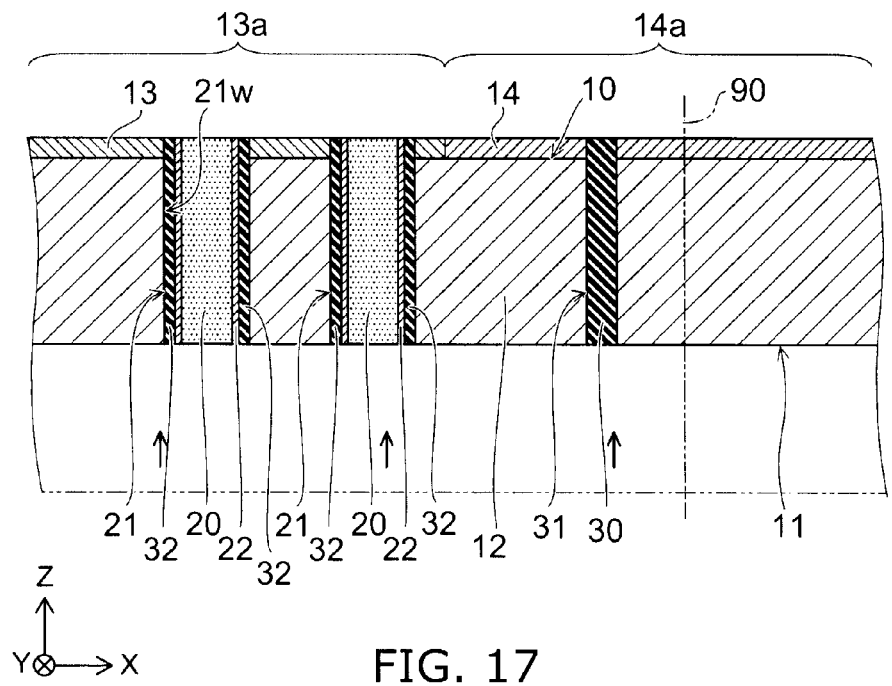
FIG. 17 is a schematic sectional view for describing the process for manufacturing a semiconductor chip according to the fifth embodiment.

FIG. 17 is a schematic sectional view for describing the process for manufacturing a semiconductor chip according to the fifth embodiment. More specifically, FIG. 17 shows a manufacturing process for grinding the back surface side of the semiconductor substrate.

After the via 20 is formed, as shown in FIG. 17, the semiconductor substrate 12 is ground on the back surface 11 side to expose the via 20 and the insulating layer 30 from the back surface 11.

Subsequently, the semiconductor substrate 12 is singulated along a dicing line 90. Also by such a manufacturing process, the semiconductor chip 1A can be formed.

Sixth Embodiment

Figure 18:
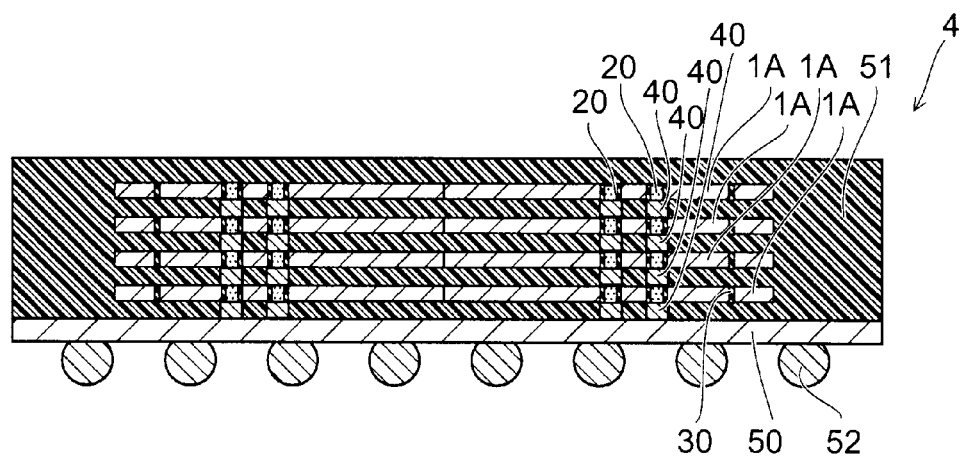
FIG. 18 is a schematic sectional view of a semiconductor device according to a sixth embodiment.

FIG. 18 is a schematic sectional view of a semiconductor device according to a sixth embodiment.

The semiconductor device 4 shown in FIG. 18 is a multi-chip package type semiconductor device. FIG. 18 shows an example in which the semiconductor chips 1A are stacked on a wiring substrate 50. On the lower surface side of the wiring substrate 50, a plurality of solder balls 52 serving as external connection terminals are arranged.

The semiconductor chip stacked in the semiconductor device 4 is not limited to the semiconductor chip 1A. One of the semiconductor chips 1A, 1B, 2, 3 is stacked in a number of two or more. As shown in FIG. 18, when the semiconductor chips 1A are stacked, the vias 20 of the respective semiconductor chips 1A are connected to each other by an electrode 40. The two or more semiconductor chips 1A are sealed with a sealing resin 51.

The embodiments have been described above with reference to examples. However, the embodiments are not limited to these examples. More specifically, these examples can be suitably modified by those skilled in the art. Such modifications are also encompassed within the scope of the embodiments as long as they include the features of the embodiments. The components included in the above examples and their layout, material, condition, shape, size and the like are not limited to those illustrated, but can be suitably modified.

Furthermore, the components included in the above embodiments can be combined as long as technically feasible. Such combinations are also encompassed within the scope of the embodiments as long as they include the features of the embodiments. In addition, those skilled in the art can conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

According to the invention, configurations as described in the following addenda can be considered.

(Addendum 1)

A method for manufacturing a semiconductor chip, comprising:

preparing a semiconductor substrate having a first major surface and a second major surface on opposite side from the first major surface, the semiconductor substrate being provided with a circuit section including an element and a wiring and a guard ring structure section surrounding the circuit section on the first major surface side;

forming a via hole in the semiconductor substrate of a circuit region including the circuit section and forming a first trench in the semiconductor substrate of an outer peripheral region surrounding the circuit region and including the guard ring structure section as viewed in a direction perpendicular to the first major surface so that width of the first trench in a direction parallel to the first major surface is narrower than width of the via hole in the parallel direction;

forming a first insulating layer on a side surface of the via hole and forming a second insulating layer in the first trench; and forming a via connected to the circuit section in the via hole.

(Addendum 2)

The method according to addendum 1, wherein the via hole opening part of the circuit section to the second major surface side is formed from the second major surface toward the first major surface of the semiconductor substrate, and the first trench opening part of the guard ring structure section to the second major surface side is formed from the second major surface toward the first major surface of the semiconductor substrate.

(Addendum 3)

The method according to addendum 1, further comprising, after the forming a first insulating layer on a side surface of the via hole and forming a second insulating layer in the first trench:

forming a first barrier metal layer via the first insulating layer in the via hole and forming a second barrier metal layer via the second insulating layer in the first trench.

(Addendum 4)

The method according to addendum 3, wherein the first barrier metal layer and the second barrier metal layer are formed by forming a barrier metal film in the via hole, in the first trench, and on the second major surface, and then removing a portion of the barrier metal film formed on the second major surface.

(Addendum 5)

The method according to addendum 3, wherein the forming a second insulating layer includes:

collectively forming an insulating film on the second major surface, on the side surface of the via hole, and inside the first trench; and forming the first insulating layer on the side surface of the via hole and forming the second insulating layer in the first trench by removing a portion of the insulating film on the second major surface.

(Addendum 6)

The method according to addendum 1, wherein from the first major surface toward the second major surface of the semiconductor substrate, the via hole penetrating to a portion of the circuit section and extending into the semiconductor substrate below the portion of the circuit section is formed, and the first trench penetrating to a portion of the guard ring structure section and extending into the semiconductor substrate below the portion of the guard ring structure section is formed.

(Addendum 7)

The method according to addendum 6, further comprising, after the forming a via:

exposing the via and the insulating layer from the second major surface by grinding the semiconductor substrate on the second major surface side.

(Addendum 8)

A method for manufacturing a semiconductor chip, comprising:

preparing a semiconductor substrate having a first major surface and a second major surface on opposite side from the first major surface;

forming a via hole in the semiconductor substrate from the first major surface toward the second major surface in a circuit region formed on the first major surface side of the semiconductor substrate and forming a first trench in the semiconductor substrate from the first major surface toward the second major surface in an outer peripheral region surrounding the circuit region so that width of the first trench in a direction parallel to the first major surface is narrower than width of the via hole in the parallel direction;

forming a first insulating layer on a side surface of the via hole and forming a second insulating layer in the first trench;

forming a via connectable to the circuit section in the via hole;

forming a circuit section including an element and a wiring in the circuit region of the semiconductor substrate and forming a guard ring structure section in the outer peripheral region of the semiconductor substrate; and exposing the via and the insulating layer from the second major surface by grinding the semiconductor substrate on the second major surface side.

(Addendum 9)

The method according to addendum 8, further comprising, after the forming a first insulating layer on a side surface of the via hole and forming a second insulating layer in the first trench:

forming a first barrier metal layer via the first insulating layer in the via hole and forming a second barrier metal layer via the second insulating layer in the first trench.

(Addendum 10)

The method according to addendum 8, wherein the forming a second insulating layer includes:

collectively forming an insulating film on the first major surface, on the side surface of the via hole, and inside the first trench; and forming the first insulating layer on the side surface of the via hole and forming the second insulating layer in the first trench by removing a portion of the insulating film on the first major surface.

What is claimed is:

1. A semiconductor chip comprising:
a semiconductor substrate having a first major surface and a second major surface on an opposite side from the first major surface, the semiconductor substrate being provided with a circuit section including an element and a wiring and a guard ring structure section surrounding the circuit section on the first major surface side;
a plurality of vias provided respectively in a plurality of via holes extending from the first major surface side to the second major surface side of the semiconductor substrate,
as viewed in a direction perpendicular to the first major surface of the semiconductor substrate,
the plurality of via holes being located in a circuit region including the circuit section; and
an insulating layer provided in a first trench extending from the first major surface side to the second major surface side of the semiconductor substrate,
as viewed in the direction perpendicular to the first major surface of the semiconductor substrate,
the first trench being located in an outer peripheral region surrounding the circuit section and including the guard ring structure section, and
a width of the first trench in a direction parallel to the first major surface being narrower than a width of each via hole of the plurality of via holes in the parallel direction.

2. The chip according to claim 1, wherein as viewed in the direction perpendicular to the first major surface of the semiconductor substrate, the circuit region is surrounded with the first trench.

3. The chip according to claim 1, wherein as viewed in the direction perpendicular to the first major surface of the semiconductor substrate, outside the insulating layer provided in the first trench, the chip further comprises an insulating layer provided in another first trench surrounding the first trench.

4. The chip according to claim 1, wherein
as viewed in the direction perpendicular to the first major surface of the semiconductor substrate, the semiconductor substrate of the outer peripheral region includes a portion where the semiconductor substrate on the circuit region side and the semiconductor substrate on opposite side from the circuit region are connected across the first trench,
the portion is sandwiched between a first end of the first trench and a second end of the first trench, and
the chip further comprises an insulating layer provided in a second trench extending from the first end or the second end outside the first trench.

5. The chip according to claim 4, wherein the first trench and the second trench are opposed to each other across the semiconductor substrate.

6. The chip according to claim 4, wherein the second trench extends in parallel to the first trench.

7. The chip according to claim 4, wherein in the direction parallel to the first major surface of the semiconductor substrate, as viewed from the outer peripheral region to the circuit region, the portion is shielded by the insulating layer provided in the second trench.

8. The chip according to claim 1, further comprising:
a barrier metal layer inserted into the insulating layer.

9. The chip according to claim 8, wherein a barrier metal layer including same material as the barrier metal layer is provided between the via and the semiconductor substrate.

10. The chip according to claim 1, wherein material of the insulating layer includes at least one of silicon nitride ($Si_3N_4$), silicon carbide (SiC), silicon carbonitride (SiCN), and silicon oxide ($SiO_2$).

11. The chip according to claim 1, wherein an insulating layer including same material as the insulating layer is provided between the via and the semiconductor substrate.

12. The chip according to claim 1, wherein as viewed in the direction perpendicular to the first major surface of the semiconductor substrate, the first trench is a closed loop-shaped trench.

13. The chip according to claim 1, wherein in the direction parallel to the first major surface of the semiconductor substrate, as viewed from the outer peripheral region to the circuit region, the semiconductor substrate in the circuit region is separated by the insulating layer provided in the first trench.

14. The chip according to claim 1, wherein a space is formed in the insulating layer provided in the first trench.

15. The chip according to claim 1, wherein
as viewed in the direction perpendicular to the first major surface of the semiconductor substrate, the semiconductor substrate of the outer peripheral region includes a portion where the semiconductor substrate on the circuit region side and the semiconductor substrate on opposite side from the circuit region are connected across the first trench,
the portion is sandwiched between a first end of the first trench and a second end of the first trench, and
the chip further comprises an insulating layer provided in a second trench extending from the first end or the second end inside the first trench.

16. The chip according to claim 1, wherein the first trench is discontinuous by a portion of the semiconductor substrate.

17. The chip according to claim 16, further comprising an insulating layer provided in a second trench located outside the portion of the semiconductor substrate.

18. A semiconductor chip comprising:
a semiconductor substrate having a first major surface and a second major surface on an opposite side from the first major surface, the semiconductor substrate being provided with a circuit section including an element and a wiring and a guard ring structure section surrounding the circuit section on the first major surface side;
a plurality of vias provided respectively in a plurality of via holes extending from the first major surface side to the second major surface side of the semiconductor substrate,
as viewed in a direction perpendicular to the first major surface of the semiconductor substrate,
the plurality of via holes being located in a circuit region including the circuit section; and
a suppressing section configured to suppress diffusion of contaminating metal provided in the semiconductor substrate,
as viewed in the direction perpendicular to the first major surface of the semiconductor substrate,
the suppressing section being located in an outer peripheral region surrounding the circuit section and including the guard ring structure section, and
a width of the suppressing section located in a direction parallel to the first major surface being narrower than a width of each via hole of the plurality of via holes in the parallel direction.

19. The chip according to claim 18, wherein the suppressing section extends from the first major surface side to the second major surface side of the semiconductor substrate.

20. The chip according to claim 18, wherein as viewed in the direction perpendicular to the first major surface of the semiconductor substrate, the circuit region is surrounded with the suppressing section.

21. The chip according to claim 18, wherein in the direction parallel to the first major surface of the semiconductor substrate, as viewed from the outer peripheral region to the circuit region, the semiconductor substrate in the circuit region is separated by the suppressing section.

22. A semiconductor device comprising:
semiconductor chips, the semiconductor chip including:
a semiconductor substrate having a first major surface and a second major surface on an opposite side from the first major surface, the semiconductor substrate being provided with a circuit section including an element and a wiring and a guard ring structure section surrounding the circuit section on the first major surface side;
a plurality of vias provided respectively in a plurality of via holes extending from the first major surface side to the second major surface side of the semiconductor substrate,
as viewed in a direction perpendicular to the first major surface of the semiconductor substrate,
the plurality of via holes being located in a circuit region including the circuit section; and
an insulating layer provided in a first trench extending from the first major surface side to the second major surface side of the semiconductor substrate,
as viewed in the direction perpendicular to the first major surface of the semiconductor substrate,
the first trench being located in an outer peripheral region surrounding the circuit section and including the guard ring structure section, and
a width of the first trench in a direction parallel to the first major surface being narrower than a width of each via hole of the plurality of via holes in the parallel direction,
two or more of the semiconductor chips being stacked, and
the two or more semiconductor chips being sealed with a sealing resin.

* * * * *